(12) United States Patent
Choi et al.

(10) Patent No.: US 12,009,299 B2
(45) Date of Patent: Jun. 11, 2024

(54) SEMICONDUCTOR DEVICE AND METHOD OF FABRICATING SAME

(71) Applicant: SAMSUNG ELECTRONICS CO., LTD., Suwon-si (KR)

(72) Inventors: In-Hyuk Choi, Seoul (KR); Wonchul Lee, Seongnam-si (KR); Joonhyoung Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/137,733

(22) Filed: Apr. 21, 2023

(65) Prior Publication Data

US 2023/0260904 A1  Aug. 17, 2023

Related U.S. Application Data

(63) Continuation of application No. 17/404,757, filed on Aug. 17, 2021, now Pat. No. 11,670,591.

(30) Foreign Application Priority Data

Feb. 15, 2021 (KR) .................. 10-2021-0020108

(51) Int. Cl.
| | |
|---|---|
| *H01L 23/48* | (2006.01) |
| *H01L 23/52* | (2006.01) |
| *H01L 23/522* | (2006.01) |
| *H01L 23/528* | (2006.01) |
| *H01L 29/06* | (2006.01) |

(52) U.S. Cl.
CPC ........ *H01L 23/528* (2013.01); *H01L 23/5226* (2013.01); *H01L 29/0649* (2013.01)

(58) Field of Classification Search
CPC ............... H01L 23/528; H01L 23/5226; H01L 29/0649; H01L 28/90; H10B 12/09; H10B 12/482; H10B 12/315; H10B 12/50; H10B 12/0335; H10B 12/30
USPC ........................................................ 257/773
See application file for complete search history.

(56) References Cited

U.S. PATENT DOCUMENTS

| | | | |
|---|---|---|---|
| 7,463,059 B2 | 12/2008 | Maurawe | |
| 7,534,719 B2 | 5/2009 | Spinner, III et al. | |
| 8,928,073 B2 | 1/2015 | Jang et al. | |
| 10,665,592 B2 | 5/2020 | Song et al. | |
| 11,411,010 B2 * | 8/2022 | Seong | H10B 12/0335 |
| 2002/0081852 A1 | 6/2002 | Sandhu | |

(Continued)

FOREIGN PATENT DOCUMENTS

| | | |
|---|---|---|
| KR | 100734251 B1 | 7/2007 |
| KR | 1020120003692 A | 1/2012 |

*Primary Examiner* — Theresa T Doan
(74) *Attorney, Agent, or Firm* — Fish & Richardson P.C.

(57) ABSTRACT

A semiconductor device includes; a semiconductor substrate including a first region and a second region, a first interlayer insulating layer on the second region, a capping layer disposed on the first interlayer insulating layer, an upper surface of the capping layer includes a first trench, conductive patterns spaced apart on the capping layer, side surfaces of the conductive patterns are aligned with inner side surfaces of the first trench, and a peripheral separation pattern disposed in the first trench to cover the side surfaces of the conductive patterns. The peripheral separation pattern has a first thickness on the side surfaces of the conductive patterns and a second thickness greater than or equal to the first thickness on a lower surface.

20 Claims, 20 Drawing Sheets

(56) References Cited

U.S. PATENT DOCUMENTS

| | | |
|---|---|---|
| 2002/0113271 A1 | 8/2002 | Noguchi et al. |
| 2007/0238280 A1 | 10/2007 | Seo et al. |
| 2011/0260286 A1* | 10/2011 | Lee ............... H01L 27/105 |
| | | 438/430 |
| 2014/0038387 A1 | 2/2014 | Kishida |
| 2015/0060970 A1 | 3/2015 | Sasaki |
| 2016/0329337 A1 | 11/2016 | Hwang et al. |
| 2018/0337186 A1 | 11/2018 | Chang et al. |

* cited by examiner

SEMICONDUCTOR DEVICE AND METHOD OF FABRICATING SAME

CROSS-REFERENCE TO RELATED APPLICATION

This is a Continuation of U.S. application Ser. No. 17/404,757, filed Aug. 17, 2021, and a claim priority under 35 U.S.C. § 119 to Korean Patent Application No. 10-2021-0020108 filed on Feb. 15, 2021 in the Korean Intellectual Property Office, the subject matter of which is hereby incorporated by reference.

BACKGROUND

The inventive concept relates generally to semiconductor devices and methods of fabricating same.

Continuing demands exist for semiconductor devices that are increasingly small in size, diverse and powerful in function(s), and/or inexpensive to make. As a result, contemporary and emerging semiconductor devices are very densely integrated. In order to further increase the integration density of semiconductor devices, it is often necessary to reduce linewidths of patterns and spacing distances between elements. However, highly complex and/or very expensive fabrication technologies are required to reduce pattern linewidths. Accordingly, many studies are ongoing into new approaches, methods and/or technologies that may increase the integration density of semiconductor devices.

SUMMARY

Embodiments of the inventive concept provide semiconductor devices providing improved reliability. Other embodiments of the inventive concept provide methods of fabricating semiconductor devices providing improved manufacturing yield.

According to an embodiment of the inventive concept, a semiconductor device may include; a semiconductor substrate including a first region and a second region, a first interlayer insulating layer covering the second region, a capping layer disposed on the first interlayer insulating layer, wherein an upper surface of the capping layer includes a first trench, conductive patterns spaced apart on the capping layer, wherein side surfaces of the conductive patterns are aligned with inner side surfaces of the first trench, and a peripheral separation pattern disposed in the first trench to cover the side surfaces of the conductive patterns. The peripheral separation pattern has a first thickness on the side surfaces of the conductive patterns and a second thickness greater than or equal to the first thickness on a lower surface.

According to an embodiment of the inventive concept, a semiconductor device may include; a semiconductor substrate including a cell array region and a peripheral region, a bit line on the semiconductor substrate crossing the cell array region, a bit line capping pattern on the bit line, a landing pad placed on the bit line capping pattern and electrically isolated from the bit line, a landing pad separation pattern contacting a side surface of the landing pad, a first interlayer insulating layer covering the peripheral region, a capping layer on the first interlayer insulating layer, wherein an upper surface of the capping layer includes a first trench, conductive patterns spaced apart on the capping layer, wherein side surfaces of the conductive patterns are aligned with inner side surfaces of the first trench, and a peripheral separation pattern filling the first trench to cover the side surfaces of the conductive patterns. The peripheral separation pattern has a first thickness on the side surfaces of the conductive patterns, and a second thickness greater than or equal to the first thickness on a lower surface of the first trench.

According to an embodiment of the inventive concept, a semiconductor device may include; a semiconductor substrate including a cell array region and a peripheral region, a first interlayer insulating layer covering the peripheral region, a capping layer disposed on the first interlayer insulating layer, wherein an upper surface of the capping layer includes a first trench, conductive patterns spaced apart on the capping layer, wherein side surfaces of the conductive patterns are aligned with inner side surfaces of the first trench, a peripheral separation pattern disposed in the first trench to cover the side surfaces of the conductive patterns, wherein the peripheral separation pattern includes a first peripheral sub-insulating pattern, a second peripheral sub-insulating pattern, and a third peripheral sub-insulating pattern, which are sequentially stacked, landing pads disposed on the cell array region, and a landing pad separation pattern disposed between the landing pads. The landing pad separation pattern includes a first cell sub-insulating pattern, a second cell sub-insulating pattern, and a third cell sub-insulating pattern, which are sequentially stacked, and the second peripheral sub-insulating pattern includes a same material as the second cell sub-insulating pattern.

BRIEF DESCRIPTION OF THE DRAWINGS

The making and use of the inventive concept may be more clearly understood upon consideration of the following written description together with the accompanying drawings, in which:

FIGS. 5A, 5B, 5C, 5D, 5E, 5F, 5G, 5H, 5I, 5J, 5K, 5L, 5M, 5N, 5O, 5P and 5Q (hereafter collectively, "FIGS. 5A to 5Q") are related cross-sectional views illustrating methods of fabricating a semiconductor device according to embodiments of the inventive concept.

The accompanying drawings illustrate general characteristics of semiconductor device(s) and method(s), various structural components and relationships, and/or various materials that may be used in various embodiments of the inventive concept. These drawings are not rendered to scale and may not precisely reflect real-world implementations. For example, for clarity of illustration, thickness of various material layers may be exaggerated.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
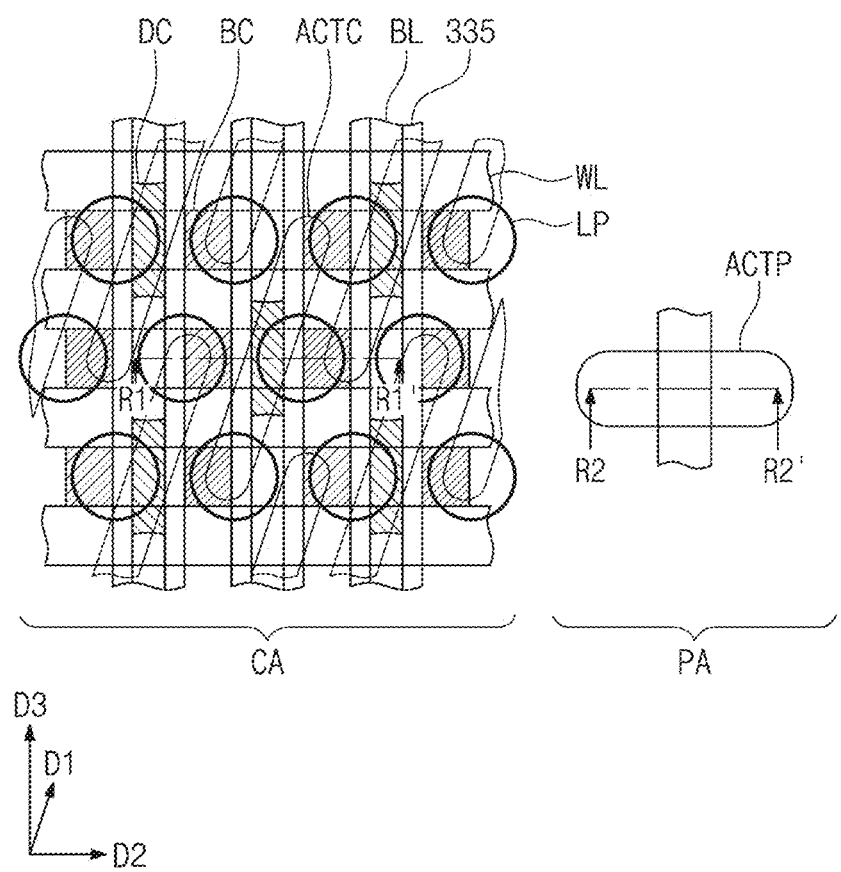
FIG. 1 is a plan (or top-down) view illustrating a semiconductor device according to embodiments of the inventive concept.
Figure 2A:
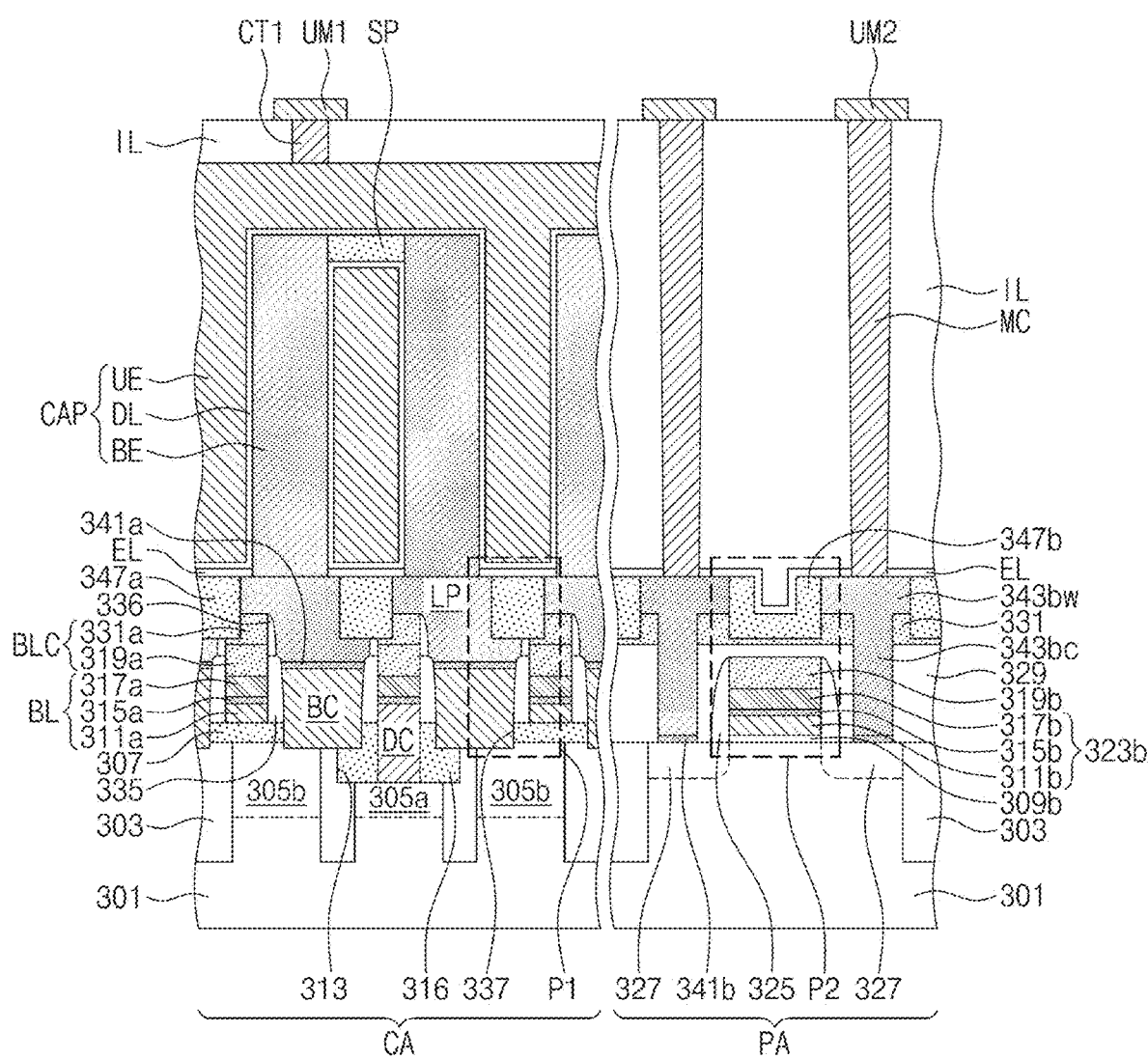
FIGS. 2A and 2B are respective cross-sectional views illustrating semiconductor devices according to embodiments of the inventive concept taken along lines R1-R1' and R2-R2' of FIG. 1.

FIGURE (FIG.) 1 is a plan view illustrating a semiconductor device according to embodiments of the inventive concept, and FIG. 2A is a cross-sectional view further illustrating the semiconductor device of FIG. 1 along lines R1-R1' and R2-R2'.

Referring to FIGS. 1 and 2A, a semiconductor substrate 301 of the semiconductor device may generally include a cell array region CA and a peripheral region PA. The peripheral region PA may be disposed substantially around the cell array region CA. Peripheral circuits, such as those commonly used to drive word lines WL and bit lines BL provided in the cell array region CA, may be variously disposed in the peripheral region PA. The peripheral region PA may be alternately be referred to as a core region or a peripheral circuit region.

A device isolation layer 303 may be disposed in the semiconductor substrate 301 to define cell active portions ACTC and a peripheral active portion ACTP. Each of the cell active portions ACTC may be associated with at least one isolation structure. For example, each of the cell active portions ACTC may be a bar-shaped pattern extending in a first direction D1. In some embodiments, the semiconductor substrate 301 may be a single-crystalline silicon substrate or a silicon-on-insulator (SOI) wafer. The device isolation layer 303 may include an oxide liner, a nitride liner, and an insulating gapfill layer. The cell active portions ACTC may be arranged in parallel in the first direction D1, wherein each of the cell active portions ACTC may be arranged such that an end portion thereof is disposed near the center of an adjacent cell active portion ACTC.

The word lines WL may be disposed in such a manner that they cross the cell active portions ACTC. For example, the word lines WL may be disposed in grooves formed in the device isolation layer 303 and the cell active portions ACTC. The word lines WL may extend in a second direction D2 that intersects the first direction D1. In some embodiments, the word lines WL may be buried in the semiconductor substrate 301.

A first impurity region 305a may be disposed in each of the cell active portions ACTC between a pair of the word lines WL, and a pair of second impurity regions 305b may be respectively disposed in opposite edge regions of each of the cell active portions ACTC. The first and second impurity regions 305a and 305b may be doped with, for example, one or more N-type impurities. The first impurity region 305a may correspond to a common drain region, and the second impurity regions 305b may correspond to a source region.

A first interlayer insulating layer 307 may be disposed on the cell array region CA of the semiconductor substrate 301. The first interlayer insulating layer 307 may be include at least one of silicon oxide, silicon nitride, or silicon oxynitride, and may be a single layer structure or a multi-layered structure.

The bit lines BL may be disposed on the first interlayer insulating layer 307. The bit lines BL may be disposed in such a manner so as to cross the word lines WL. For example, as illustrated in FIG. 1, the bit lines BL may extend in third direction D3 intersecting both the first direction D1 and the second direction D2. The bit lines BL may include a cell polysilicon pattern 311a, a cell ohmic pattern 315a, and a cell metal-containing pattern 317a, which are sequentially stacked. The cell polysilicon pattern 311a may include impurity-doped polysilicon. The cell ohmic pattern 315a may include at least one metal silicide (e.g., cobalt silicide). The cell metal-containing pattern 317a may include at least one metal (e.g., aluminum, tungsten, and copper). A bit line capping pattern BLC may be disposed on the bit line BL. The bit line capping pattern BLC may include a first bit line capping pattern 319a and a second bit line capping pattern 331a stacked on the first bit line capping pattern 319a. Here, the first bit line capping pattern 319a and the second bit line capping pattern 331a may include silicon nitride.

A side surface of the bit line BL and a lower side surface of the bit line capping pattern BLC may be covered with a first bit line spacer 335. An upper side surface of the bit line capping pattern BLC may be covered with a second bit line spacer 336. Each of the first and second bit line spacers 335 and 336 may include at least one of silicon nitride, silicon oxide, and silicon oxynitride, and may be a single layer or a multi-layered structure. The second bit line spacer 336 may be provided to have an air gap therein.

The first interlayer insulating layer 307 may be interposed between the bit line BL and the semiconductor substrate 301 and between the first bit line spacer 335 and the semiconductor substrate 301. A side surface of the first bit line spacer 335 may be aligned to a side surface of the first interlayer insulating layer 307.

The bit line BL may be electrically connected to the first impurity region 305a through a bit line contact DC. The bit line contact DC may include impurity-doped polysilicon. A recess region 313 may be formed in an upper portion of the first impurity region 305a and in an upper portion of the device isolation layer 303 adjacent thereto. The bit line contact DC may be disposed in the recess region 313. A space between a lower side surface of the bit line contact DC and an inner surface of the recess region 313 may be filled with a gapfill insulating pattern 316. The gapfill insulating pattern 316 may include at least one of silicon nitride or silicon oxide, and may be a single layer structure or a multi-layered structure.

Storage node contacts BC may be disposed between an adjacent pair of the bit lines BL. The storage node contacts BC may be spaced apart from each other. The storage node contacts BC may include impurity-doped polysilicon. The storage node contacts BC may be island-shaped patterns, which are spaced apart from each other in a plan view. The storage node contacts BC may be provided to penetrate the first interlayer insulating layer 307 and to be in contact with the second impurity regions 305b.

A storage node ohmic layer 341a may be disposed on the storage node contact BC. The storage node ohmic layer 341a may include at least one metal silicide (e.g., cobalt silicide).

A landing pad LP may be disposed on the storage node ohmic layer 341a. The landing pad LP may include at least one metal (e.g., tungsten, aluminum, and copper). An upper portion of the landing pad LP may cover an upper surface of the bit line capping pattern BLC. A center of the landing pad LP may be shifted (or offset) from a center of the storage node contact BC in the second direction D2. A portion of the bit line BL may vertically overlap the landing pad LP.

Adjacent landing pads LP may be separated by a landing pad separation pattern 347a. The landing pad separation pattern 347a may include at least one of silicon nitride, silicon oxide, and silicon carbon nitride, and may be a single layer structure or a multi-layered structure. The landing pad separation pattern 347a may extend into the second bit line capping pattern 331a and the second bit line spacer 336.

An etch stop layer EL may be disposed on the landing pads LP and the landing pad separation pattern 347a. The etch stop layer EL may include a silicon nitride layer. Bottom electrodes BE may be provided to penetrate the etch stop layer EL and to be in contact with the landing pads LP. Portions of upper side surfaces of the bottom electrodes BE may contact a supporting pattern SP. Surfaces of the bottom electrodes BE and the supporting pattern SP may be covered with a dielectric layer DL. An upper electrode UE may be disposed on the dielectric layer DL. The bottom electrode BE, the dielectric layer DL, and the upper electrode UE may constitute a capacitor CAP.

A third interlayer insulating layer IL may be stacked on the upper electrode UE. A cell contact CT1 may be provided to penetrate the third interlayer insulating layer IL and to contact the upper electrode UE. A cell interconnection line UM1 may be disposed on the upper electrode UE.

A peripheral gate electrode 323b may be disposed on the peripheral region PA of the semiconductor substrate 301. A peripheral gate insulating pattern 309b may be interposed between the peripheral gate electrode 323b and the semiconductor substrate 301. A peripheral gate capping pattern 319b may be disposed on the peripheral gate electrode 323b. Peripheral source/drain regions 327 may be disposed in portions of the semiconductor substrate 301 and at both sides of the peripheral gate electrode 323b. Opposite side surfaces of the peripheral gate electrode 323b may be covered with peripheral spacers 325. The peripheral gate electrode 323b may include a stacked combination of a peripheral polysilicon pattern 311b, a peripheral ohmic pattern 315b, and a peripheral metal-containing pattern 317b. The peripheral gate capping pattern 319b and the peripheral spacer 325 may be covered with a second interlayer insulating layer 329. A second capping layer 331 may be disposed on the second interlayer insulating layer 329.

Peripheral conductive patterns 343bw may be disposed on the second capping layer 331. An upper surface of the peripheral conductive patterns 343bw may be disposed at the same "height" (e.g., a disposition measured with respect to an arbitrarily selected horizontal plane, such as the upper surface of the semiconductor substrate 301) as upper surfaces of the landing pads LP. First peripheral contacts 343bc may be provided to penetrate the second capping layer 331 and the second interlayer insulating layer 329 and may electrically connect the peripheral source/drain regions 327, respectively. The first peripheral contacts 343bc and the peripheral conductive patterns 343bw may be connected to form a single element. A peripheral ohmic layer 341b may be interposed between the first peripheral contacts 343bc and the peripheral source/drain regions 327. A peripheral separation pattern 347b may be interposed between the peripheral conductive patterns 343bw. The etch stop layer EL may extend to cover a portion of the peripheral conductive patterns 343bw and the peripheral separation pattern 347b. The third interlayer insulating layer IL may cover the etch stop layer EL in the peripheral region PA. Second peripheral contacts MC may be provided to penetrate the third interlayer insulating layer IL and contact the peripheral conductive patterns 343bw. Peripheral interconnection lines UM2 may be disposed on the third interlayer insulating layer IL and may contact the second peripheral contacts MC.

Figure 3A:
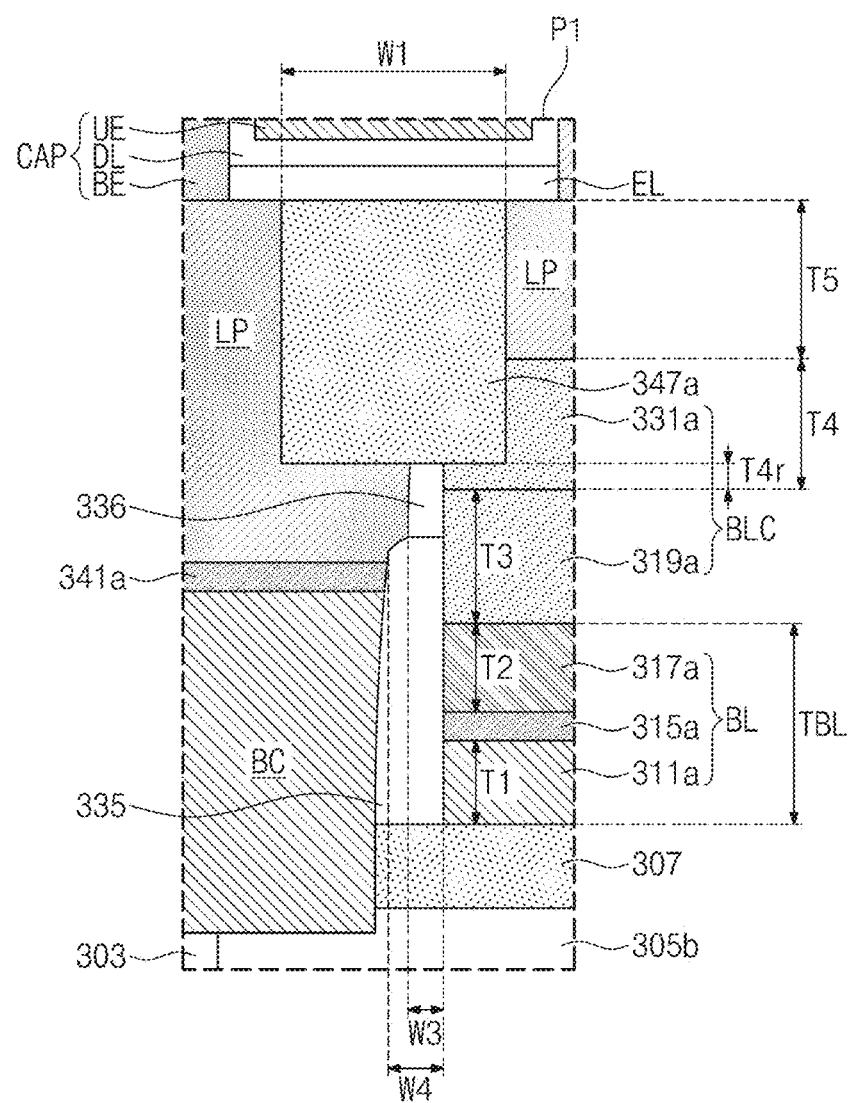
FIGS. 3A and 4A are respective, enlarged cross-sectional views variously illustrating area 'P1' of FIG. 2A, and FIGS. 3B, 3C, 3D, and 4B are respective, enlarged cross-sectional views variously illustrating area 'P2' of FIG. 2A.
Figure 3B:
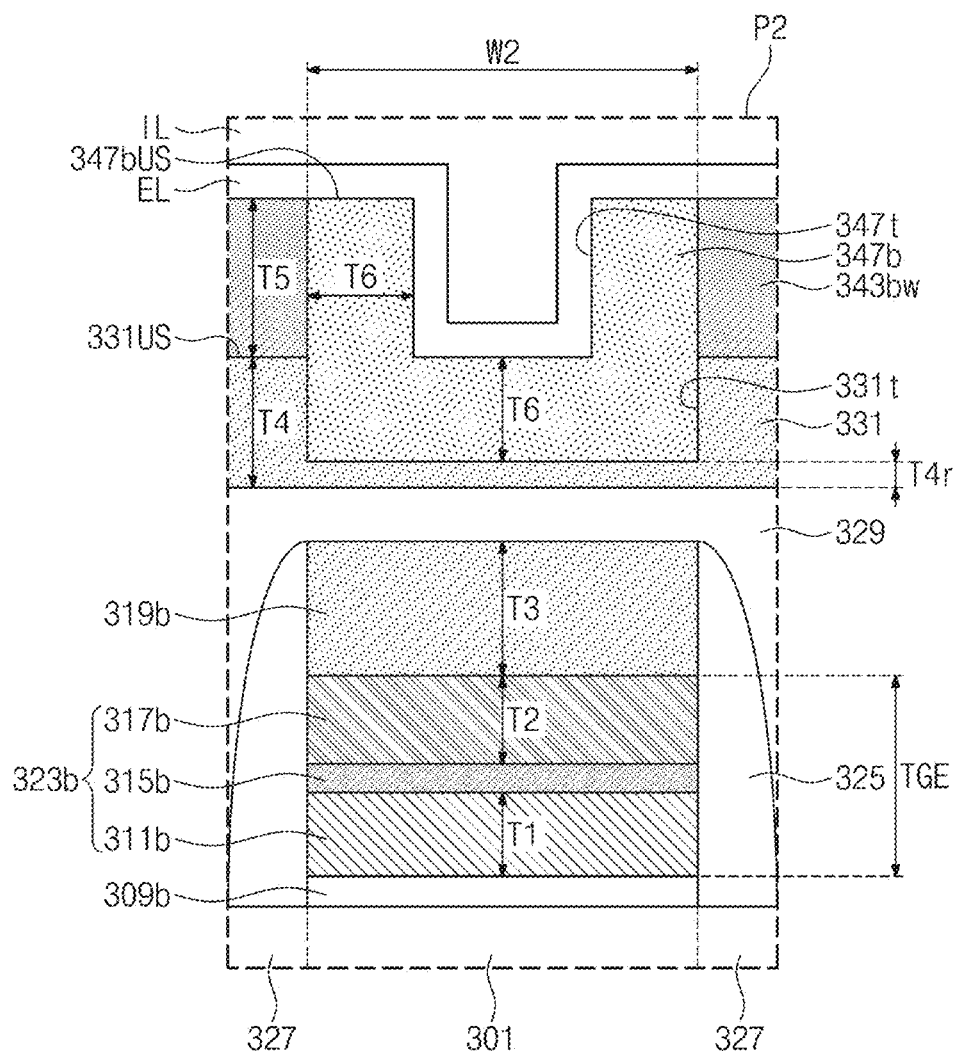
Figure 3C:
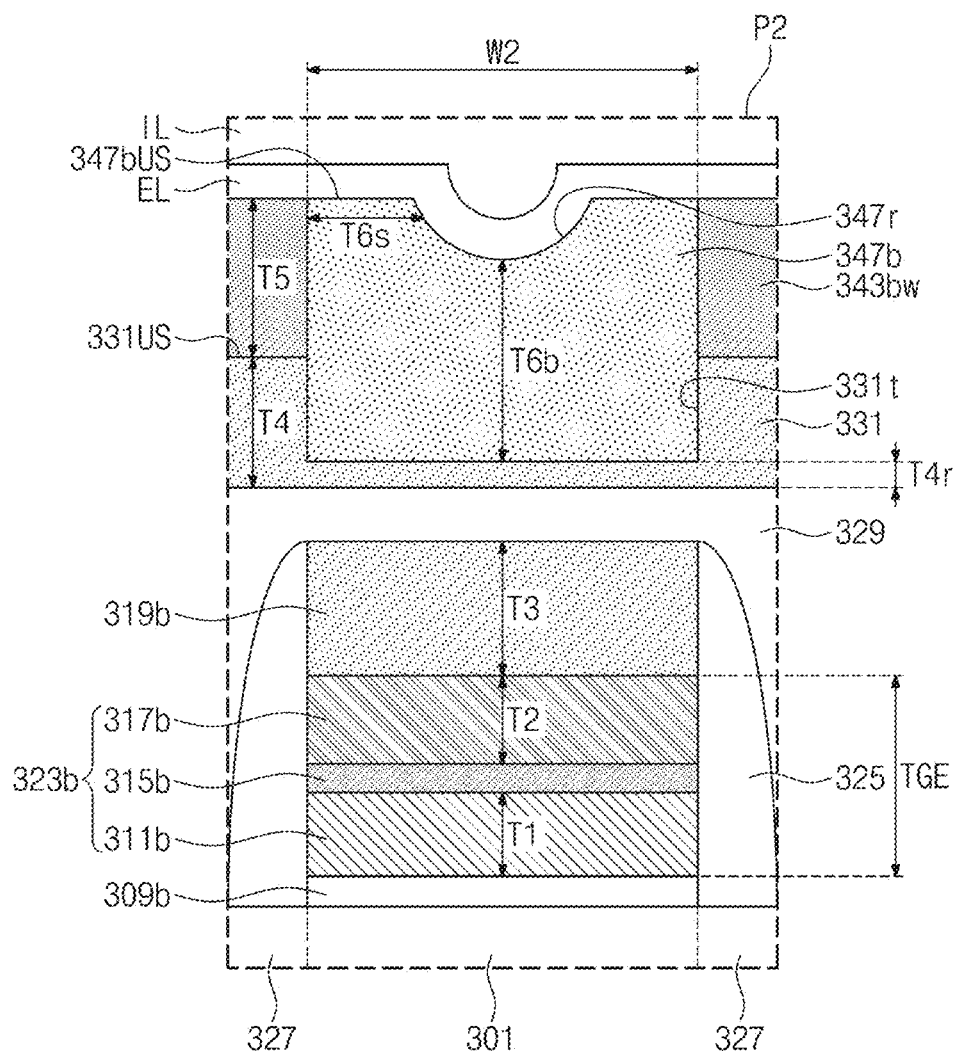
Figure 3D:
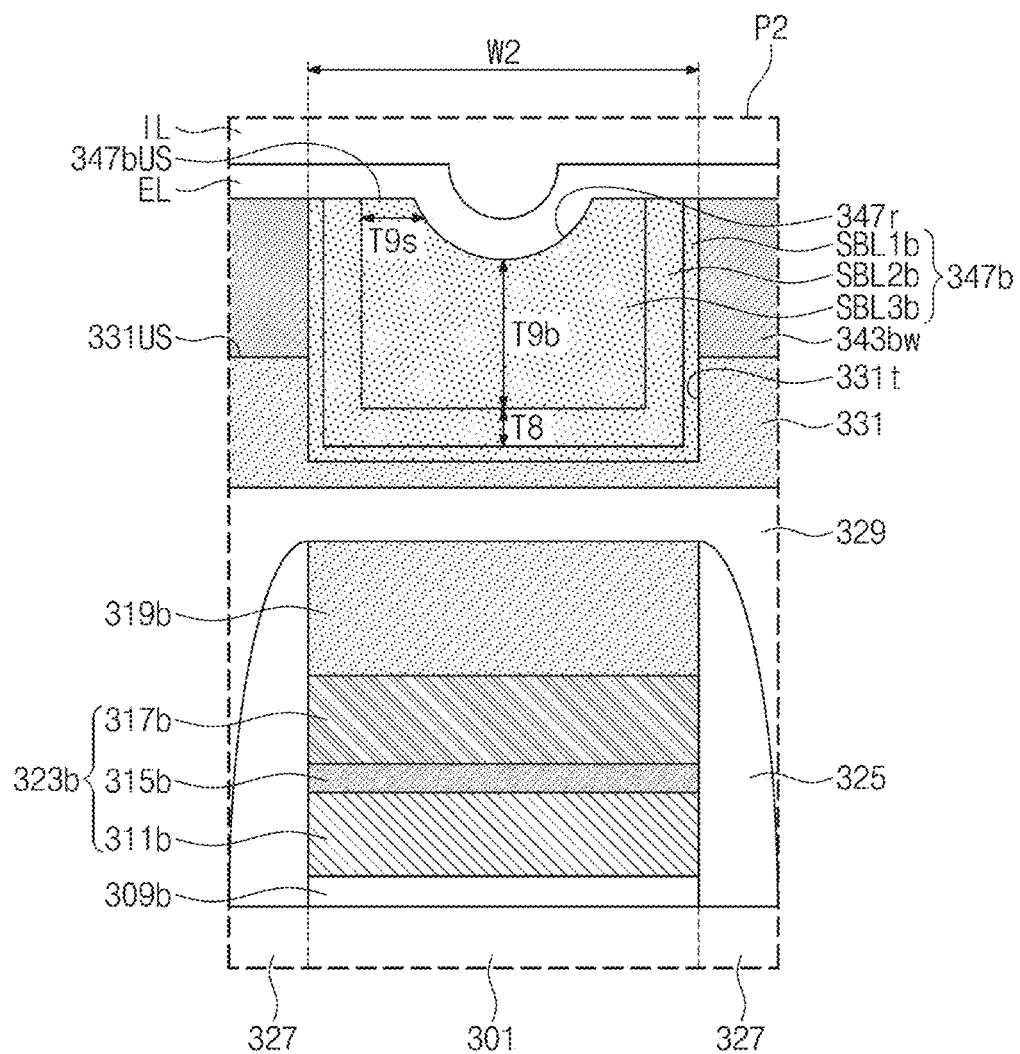
Figure 4A:
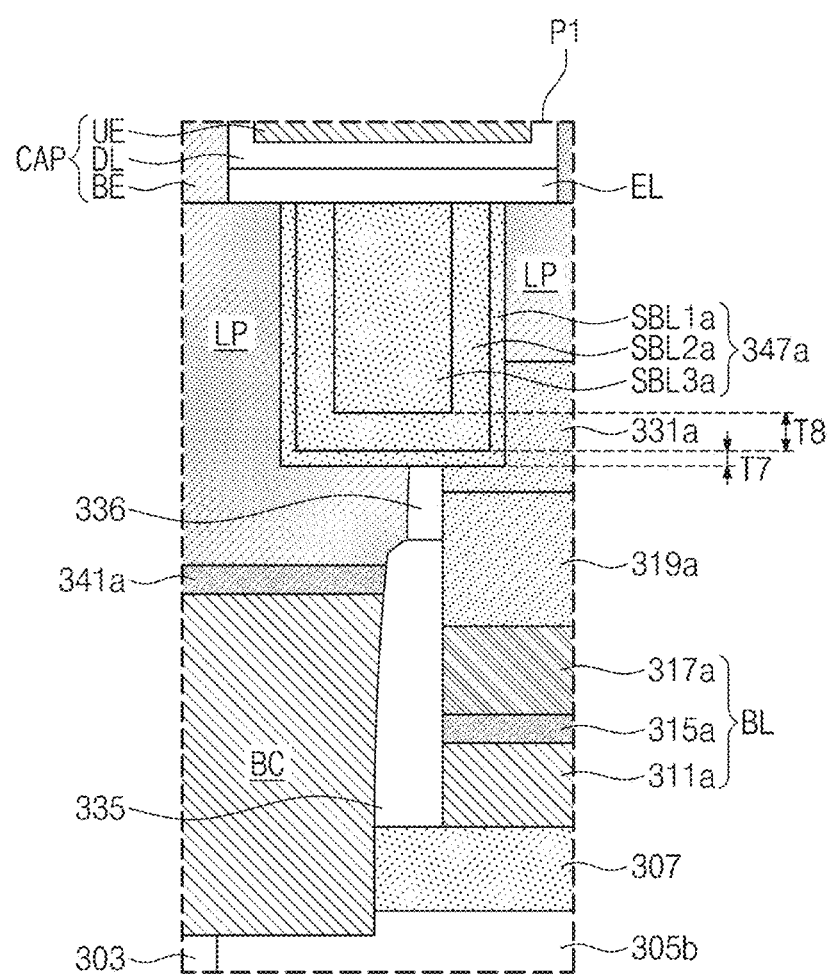

FIGS. 3A and 4A are respective, enlarged cross-sectional views further illustrating area 'P1' of FIG. 2A, and FIGS. 3B, 3C, 3D, and 4B are respective, enlarged cross-sectional views further illustrating area 'P2' of FIG. 2A.

Referring to FIGS. 2A, 3A, and 3B, each of the cell and peripheral polysilicon patterns 311a and 311b may have a first thickness T1. In some embodiments, the cell ohmic pattern 315a and the peripheral ohmic pattern 315b may include the same material and may have the same thickness. The cell metal-containing pattern 317a and the peripheral metal-containing pattern 317b may include the same material and may have the same thickness (e.g., a second thickness T2). A thickness TBL of the bit line BL on the first interlayer insulating layer 307 may be equal to a thickness TGE of the peripheral gate electrode 323b. The first bit line capping pattern 319a and the peripheral gate capping pattern 319b may include the same material and may have the same thickness (e.g., a third thickness T3). The second bit line capping pattern 331a and the second capping layer 331 may include the same material and may have the same thickness (e.g., a fourth thickness T4). The landing pad LP on the second bit line capping pattern 331a may have a fifth thickness T5, and the peripheral conductive pattern 343bw may include the same material as the landing pad LP and may have the fifth thickness T5. A thickness of the bit line capping pattern BLC may be equal to the sum of the third thickness T3 of the peripheral gate capping pattern 319b and the fourth thickness T4 of the second capping layer 331.

The peripheral separation pattern 347b and the landing pad separation pattern 347a may include the same insulating material. The landing pad separation pattern 347a may have a first width W1. The landing pad separation pattern 347a may be provided to fill a space between the landing pads LP. In some embodiments, a void or an air gap may be included in the landing pad separation pattern 347a.

An upper surface of the second capping layer 331US may include a first trench 331t. An inner surface of the first trench 331t may be aligned with a side surface of the peripheral conductive pattern 343bw. A lower surface of the first trench 331t may be spaced apart from the second interlayer insulating layer 329. Under the lower surface of the first trench 331t, the second capping layer 331 may have a fourth remaining thickness T4r. Under a lower surface of the landing pad separation pattern 347a, the second bit line capping pattern 331a may have the fourth remaining thickness T4r.

Referring to FIGS. 3A and 3B, the peripheral separation pattern 347b may conformally cover the side surface of the peripheral conductive pattern 343bw and an inner side surface and a lower surface of the first trench 331t. In this regard, the term "conformally cover" denotes a result in which a position-independent, substantially-constant thickness is achieved by one material layer in relation to at least one other material layer). For example, the peripheral separation pattern 347b may have a sixth thickness T6 on the side surface of the peripheral conductive pattern 343bw and may have the sixth thickness T6 on the lower surface of the first trench 331t. The peripheral separation pattern 347b may have a second width W2 greater than the first width W1. The sixth thickness T6 may be greater than or equal to half of the first width W1, and may be less than half of the second width W2.

Alternately, referring to FIG. 3C, the peripheral separation pattern 347b may have a sixth side thickness T6s on the side surface of the peripheral conductive pattern 343bw and may have a sixth bottom thickness T6b on the lower surface of the first trench 331t. The sixth bottom thickness T6b may be greater than the sixth side thickness T6s. An upper surface of the peripheral separation pattern 347b may have a peripheral recess region 347r.

An upper surface 347bUS of the peripheral separation pattern 347b may include a second trench 347t. The etch stop layer EL may conformally cover an inner side surface and a lower surface of the second trench 347t. The third interlayer insulating layer IL may include a portion penetrating (or inserted into) the second trench 347t.

A third width W3 of the second bit line spacer 336 may be less than a fourth width W4 of the first bit line spacer 335. Accordingly, a distance between the second bit line spacers 336 may be increased near an upper portion of the bit line capping pattern BLC. Thus, in a method of fabricating a semiconductor device consistent with an embodiment of the inventive concept, the landing pad LP may be easily connected to the storage node contact BC.

Figure 4B:
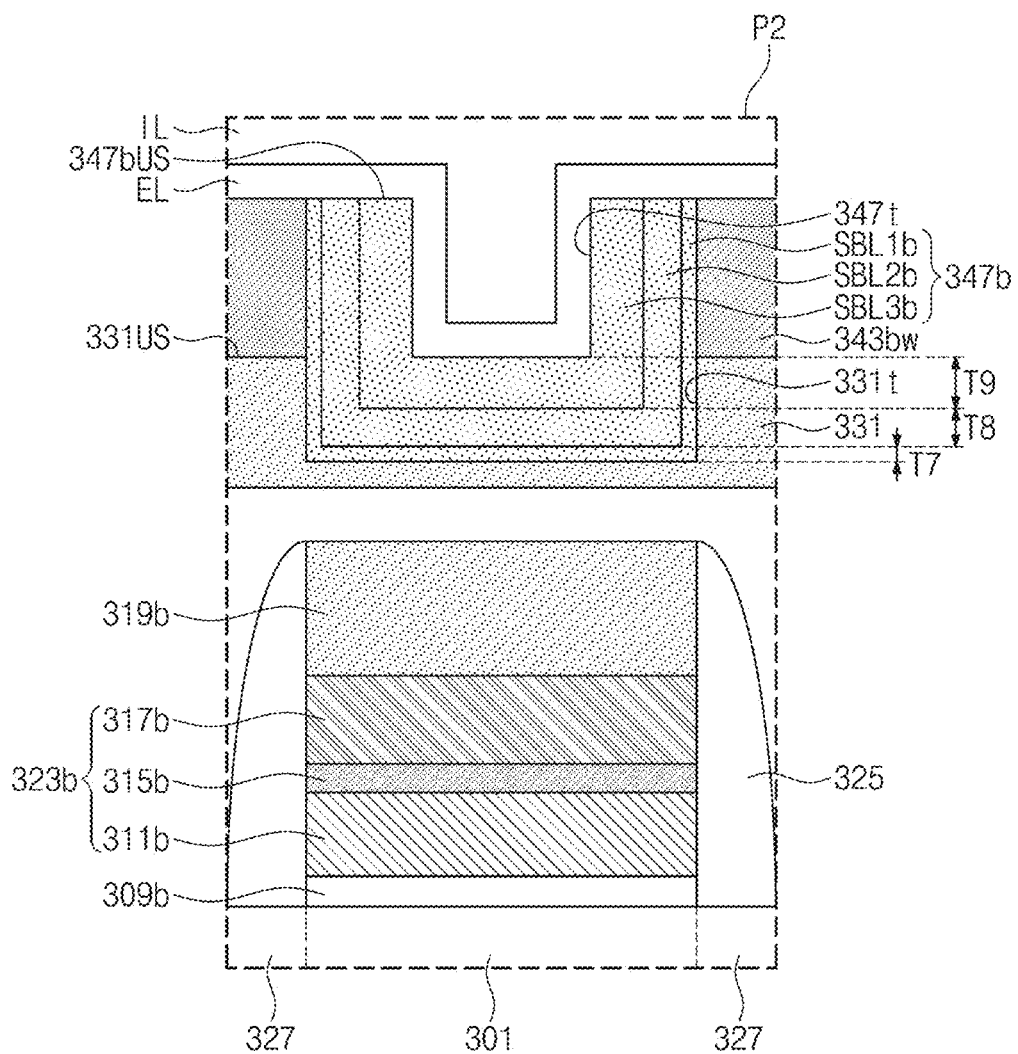

Referring to FIGS. 2A, 4A, and 4B, the landing pad separation pattern 347a may include a stacked combination of first, second and third (hereafter collectively, "first to third") cell sub-insulating patterns SBL1a to SBL3a. The peripheral separation pattern 347b may include a stacked combination of first to third peripheral sub-insulating patterns SBL1b to SBL3b. The first cell sub-insulating pattern SBL1a may include the same material as the first peripheral sub-insulating pattern SBL1b and may have a seventh thickness T7 that is constant. The second cell sub-insulating pattern SBL2a may include the same material as the second peripheral sub-insulating pattern SBL2b and may have an eighth thickness T8 that is constant. The third cell sub-insulating pattern SBL3a may include the same material as the third peripheral sub-insulating pattern SBL3b. The third cell sub-insulating pattern SBL3a may fill a space between the landing pads LP. The third peripheral sub-insulating pattern SBL3b may have a ninth thickness T9 that is constant. The second cell sub-insulating pattern SBL2a and the second peripheral sub-insulating pattern SBL2b may include a material which has an etch selectivity with respect to the first and third cell sub-insulating patterns SBL1a and SBL3a and the first and third peripheral sub-insulating patterns SBL1b and SBL3b. For example, the second cell sub-insulating pattern SBL2a and the second peripheral sub-insulating pattern SBL2b may include silicon carbon nitride (SiCN). The first and third cell sub-insulating patterns SBL1a and SBL3a and the first and third peripheral sub-insulating patterns SBL1b and SBL3b may include silicon nitride. The third peripheral sub-insulating pattern SBL3b may include an upper surface, on which the second trench 347t is formed. In the illustrated example of FIG. 4B, the sum of the seventh, eighth and ninth thicknesses T7, T8 and T9 may correspond to the sixth thickness T6 in the illustrated example of FIG. 3B. Except for the afore-described differences, the embodiments of 4A and 4B may be understood as being substantially the same as the embodiments previously described in relation to FIGS. 3A, 3B, 3C and 3D.

In some embodiments, the landing pad separation pattern 347a may be configured to have only the third cell sub-insulating pattern SBL3a, thereby omitting the first and second cell sub-insulating patterns SBL1a and SBL2a.

FIG. 3D illustrates an embodiment that may be realized by combining the embodiments of FIGS. 4B and 3C. Referring to FIG. 3D, the third peripheral sub-insulating pattern SBL3b may have a ninth side thickness T9s on the side surface of the peripheral conductive pattern 343bw and a ninth bottom thickness T9b on the lower surface of the first trench 331t. The ninth bottom thickness T9b may be greater than the ninth side thickness T9s.

Here, in some embodiments, the peripheral separation pattern 347b may have a constant sixth thickness T6, or a variable sixth thickness that increases (e.g., T6b of FIG. 3C). Accordingly, it may be possible to prevent an etchant from entering the second interlayer insulating layer 329 during a process of removing a mold layer and to prevent a short circuit issue, thereby improving the reliability of the resulting semiconductor device.

Figure 2B:
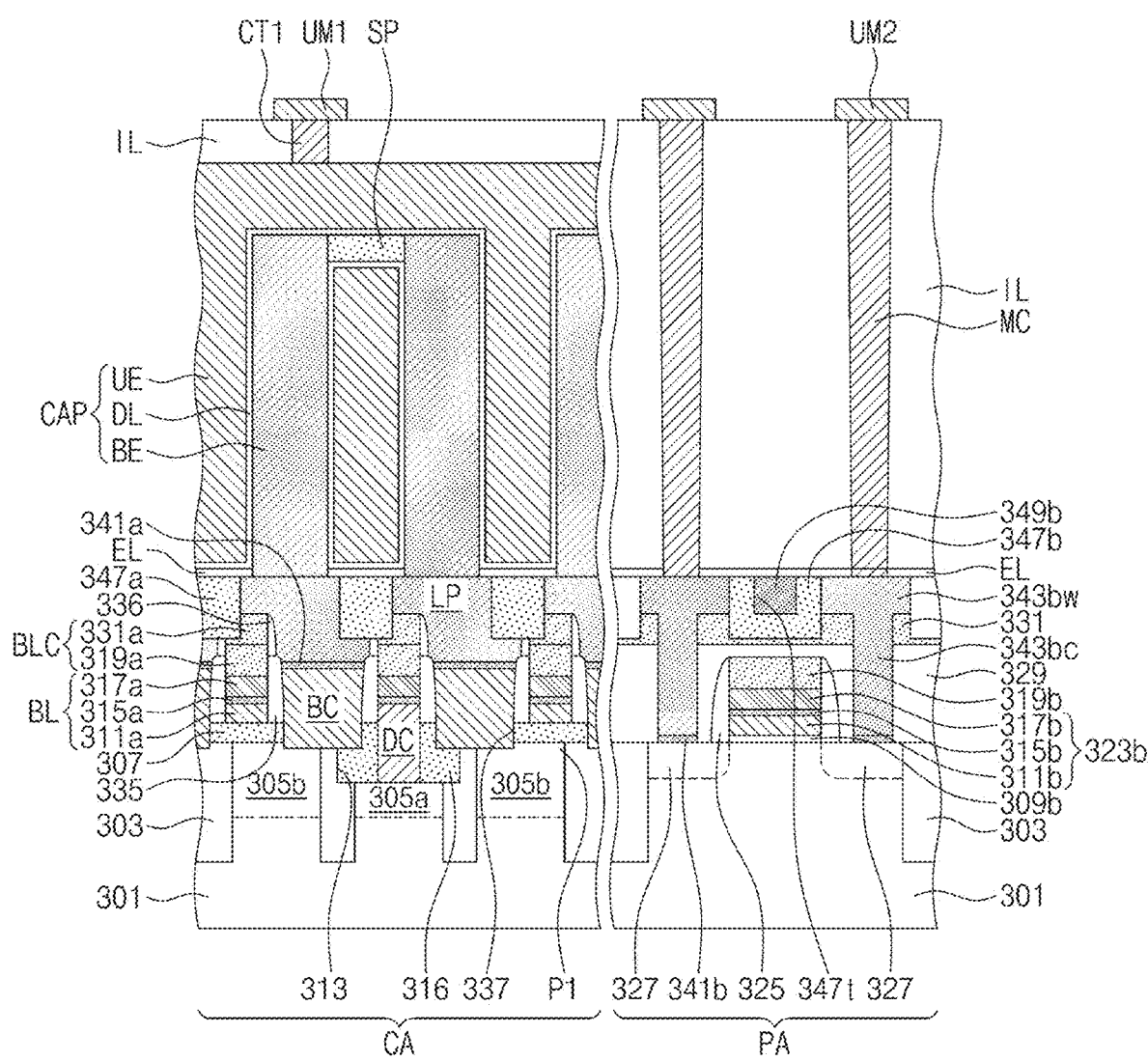

FIG. 2B is a cross-sectional view further illustrating the semiconductor device of FIG. 1 taken along the lines R1-R1' and R2-R2'.

Referring to FIG. 2B, the semiconductor device may include a protection pattern 349p filling the second trench 347t. The protection pattern 349p may include at least one an insulating material, a semiconductor material, and a conductive material having an etch selectivity with respect to the peripheral separation pattern 347b. Assuming that the peripheral separation pattern 347b has the same structure as shown in FIG. 4B, the protection pattern 349p may contact with the third peripheral sub-insulating pattern SBL3b. However, assuming that the peripheral separation pattern 347b has the same structure as shown in FIG. 3C, the protection pattern 349p may fill the peripheral recess region 347r.

The protection pattern 349p may include at least one of spin-on-hardmask (SOH) material, silicon oxide, silicon oxynitride, silicon germanium, polysilicon, and metal. The protection pattern 349p may be formed of a material having a dielectric constant less than a dielectric constant of the peripheral separation pattern 347b. In the case where the protection pattern 349p is formed of a material having a dielectric constant lower than the dielectric constant of the peripheral separation pattern 347b, a parasitic capacitance between the peripheral conductive patterns 343bw may be reduced. In the case where the protection pattern 349p contains a conductive material, the protection pattern 349p may serve as a shielding element between the peripheral conductive patterns 343bw.

In some embodiments, an upper surface of the protection pattern 349p may be coplanar with the upper surface of the peripheral separation pattern 347b and the upper surface of the peripheral conductive pattern 343bw. The etch stop layer EL may cover the protection pattern 349p. In some embodiments, the etch stop layer EL and the third interlayer insulating layer IL may not penetrate into a region between the peripheral conductive patterns 343bw. Except for the afore-described differences, the semiconductor device of FIG. 2B may include substantially the same features as those previously described in relation to FIGS. 1, 2A, 3A, 3B, 3C, 3D, 4A and 4B.

Figure 5A:
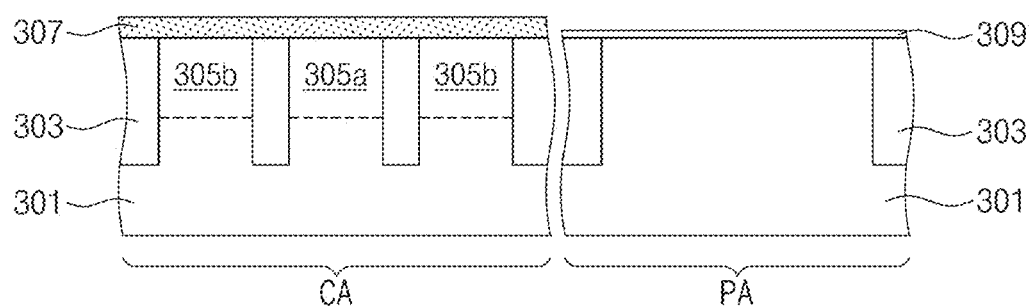
Figure 5B:
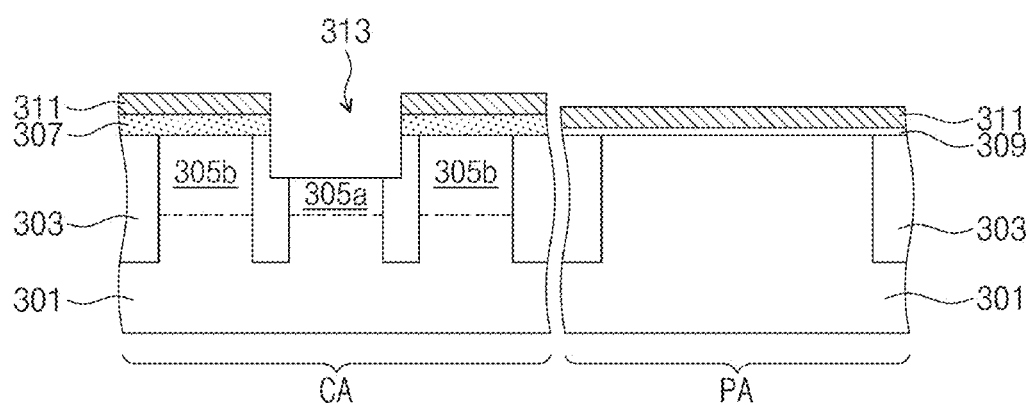
Figure 5C:
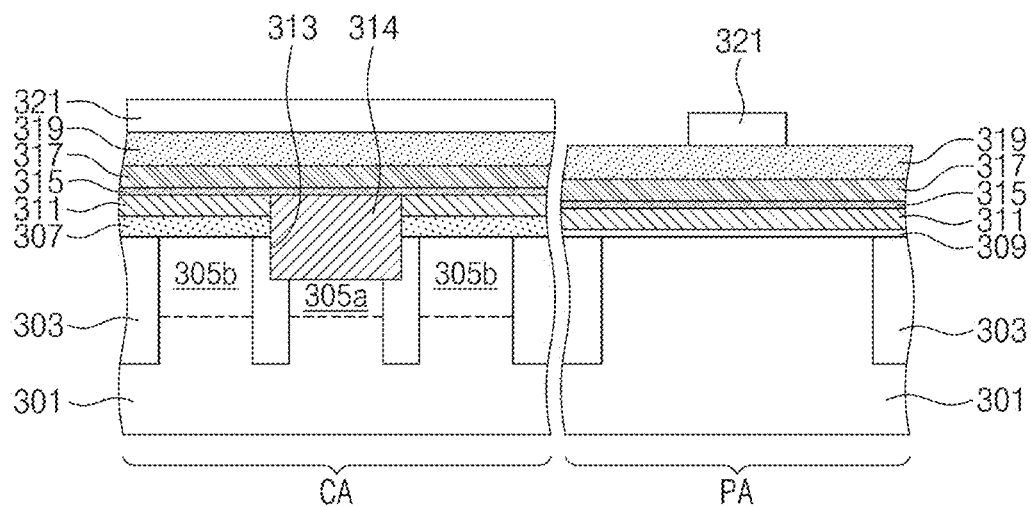
Figure 5D:
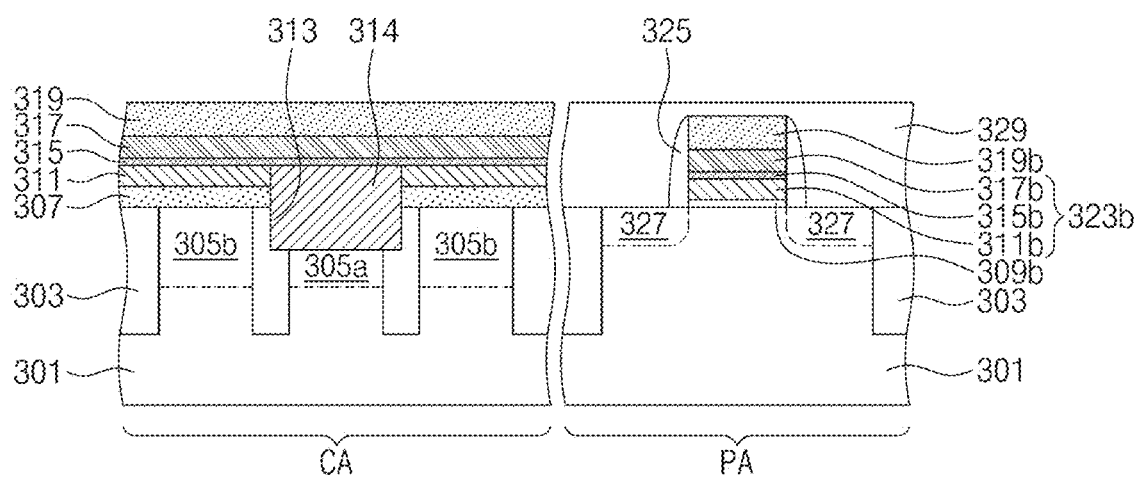
Figure 5E:
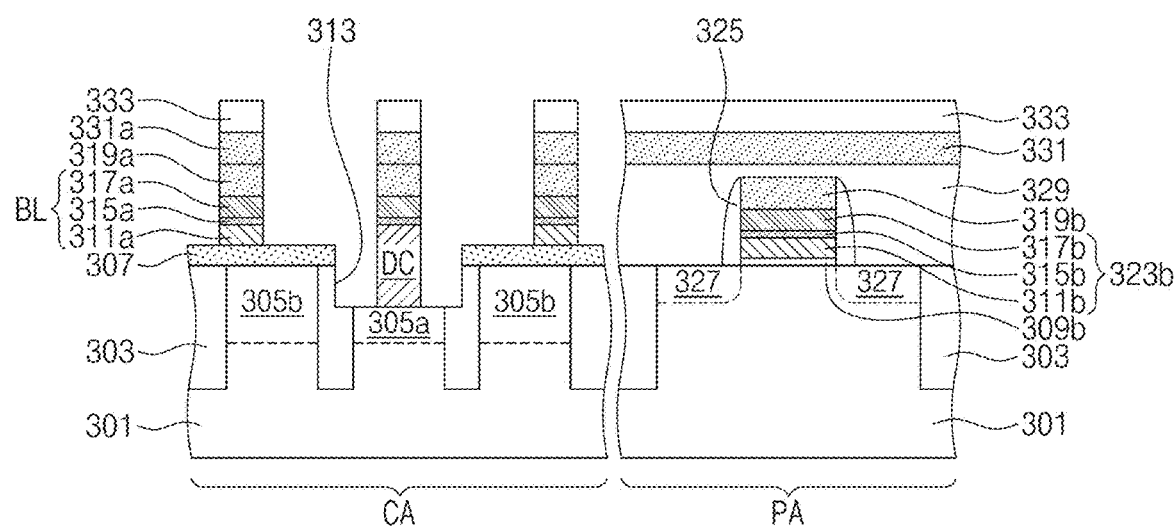
Figure 5F:
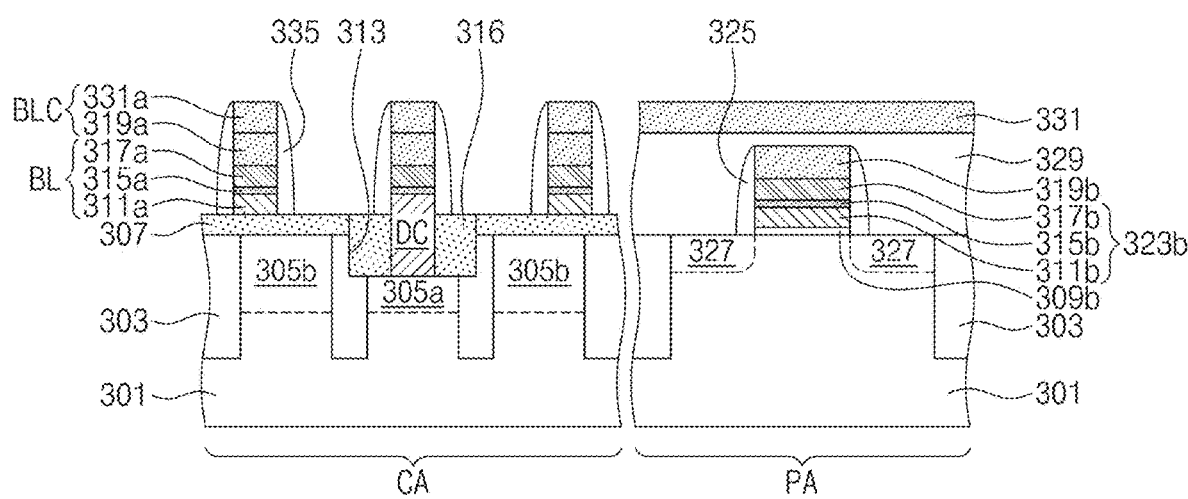
Figure 5G:
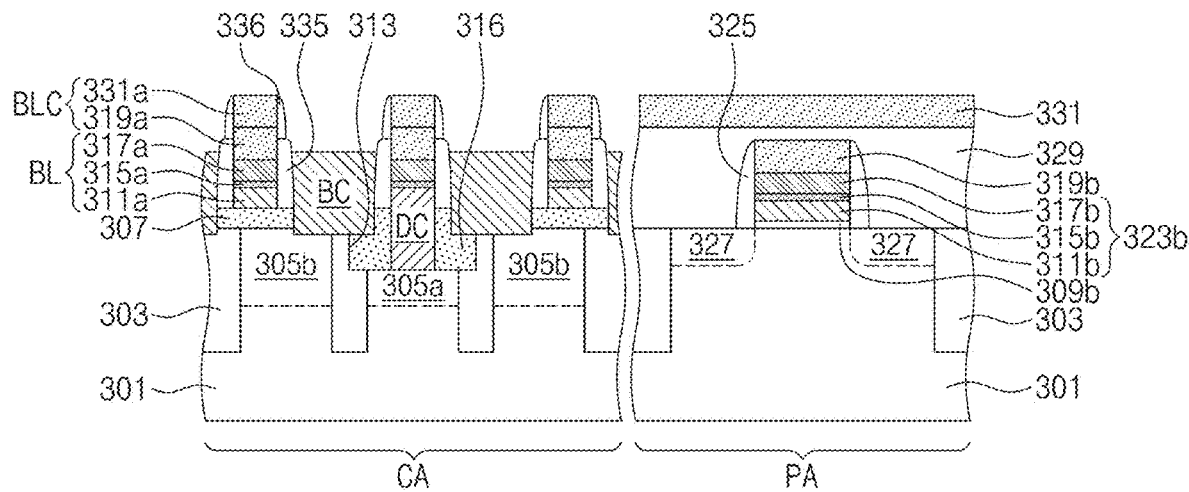
Figure 5H:
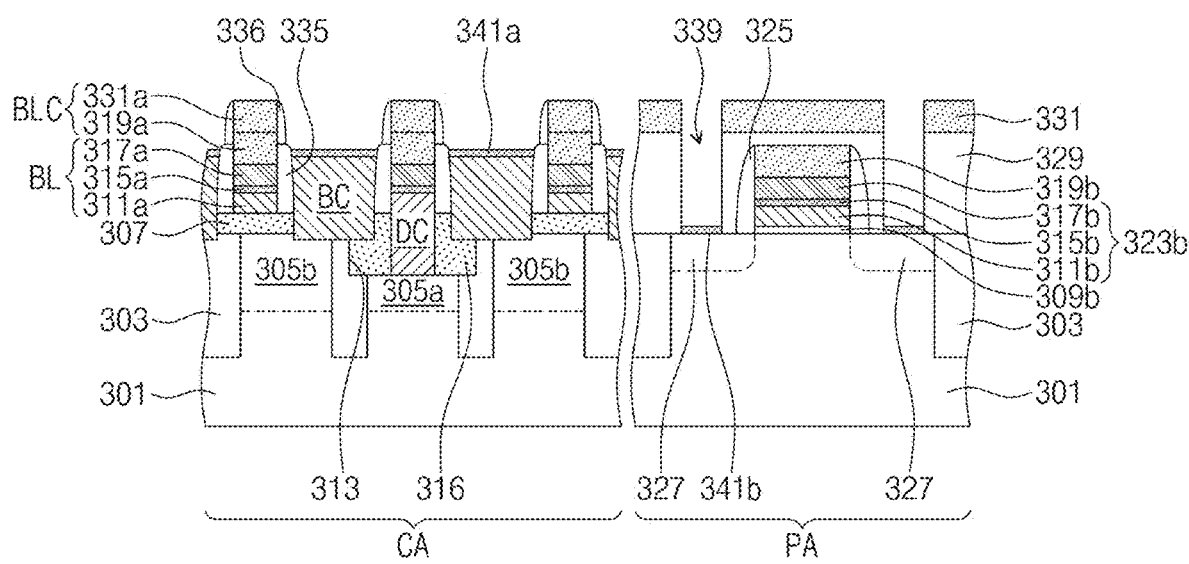
Figure 5I:
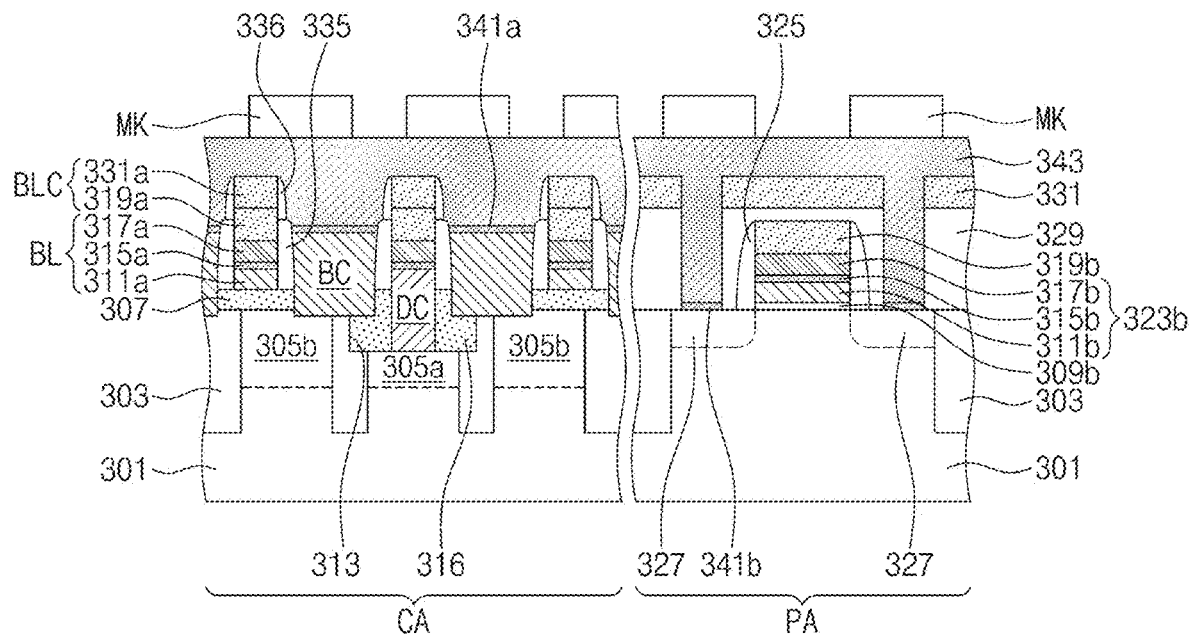
Figure 5J:
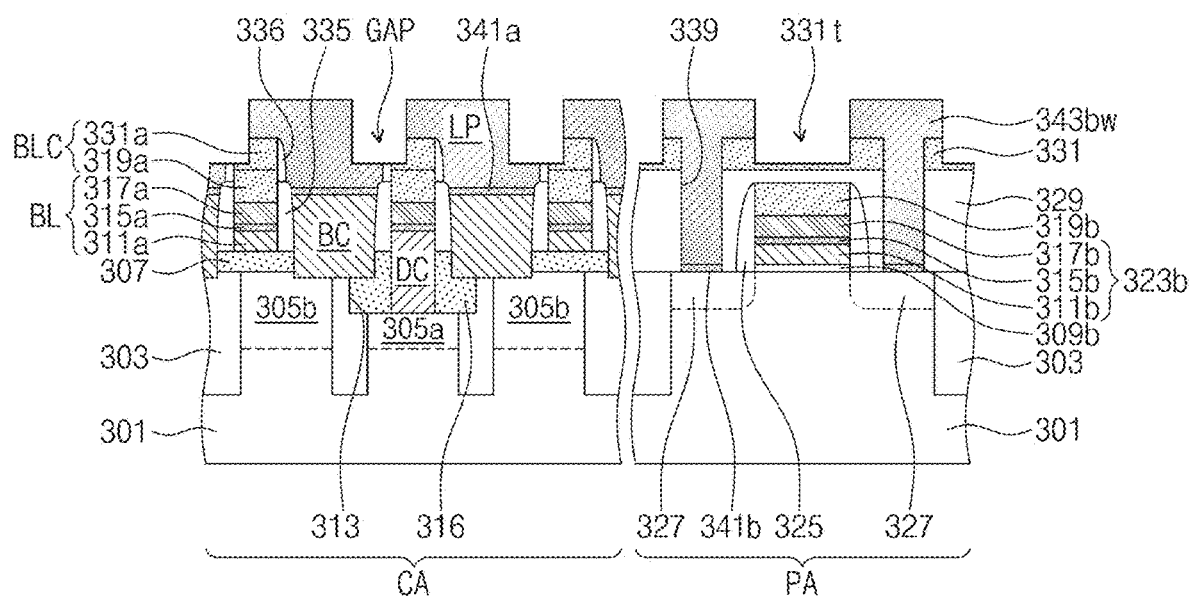
Figure 5K:
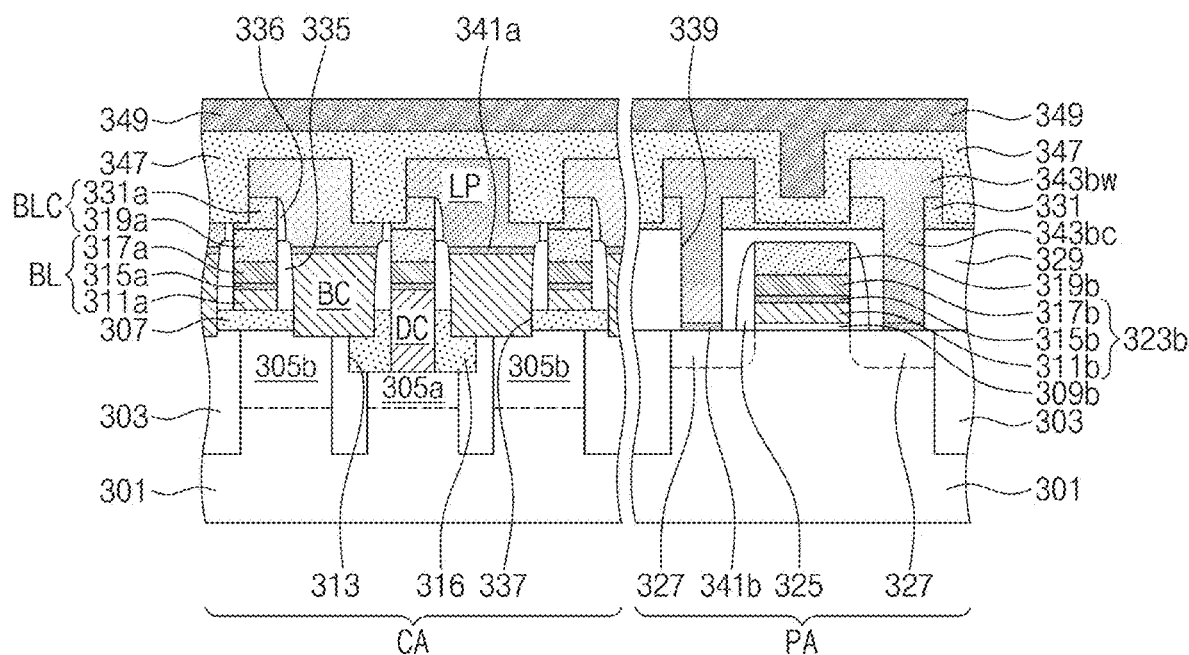
Figure 5L:
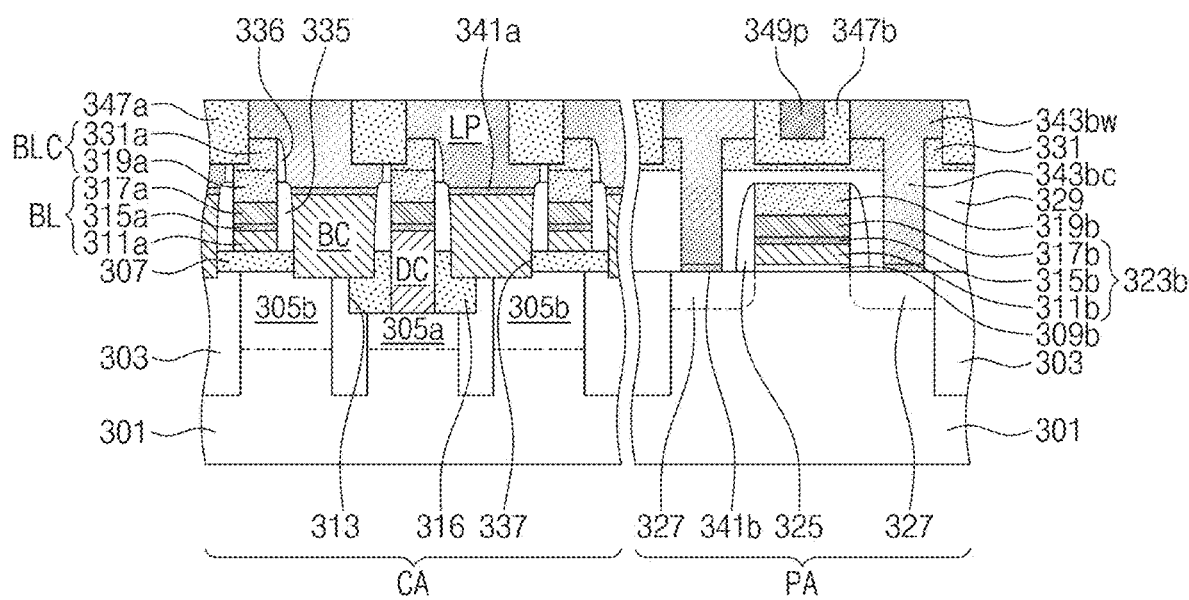
Figure 5M:
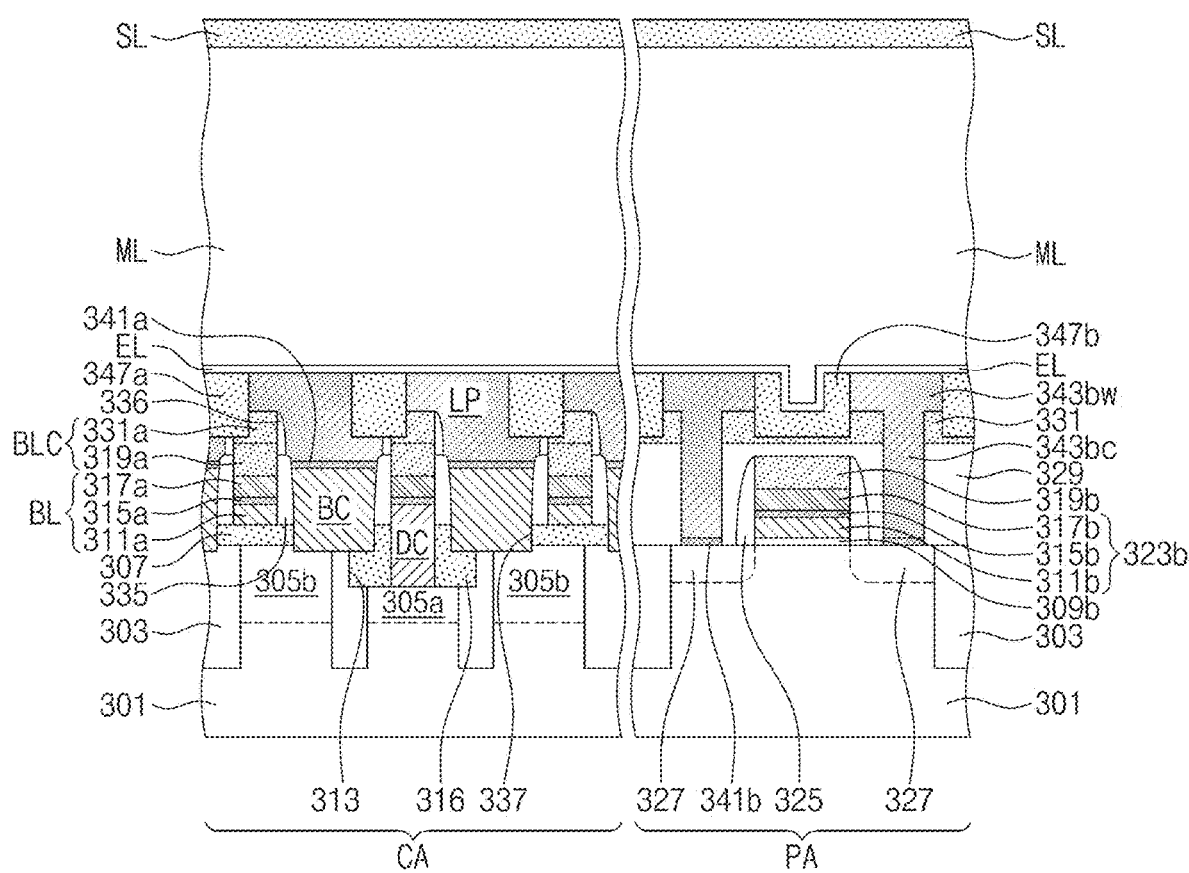
Figure 5N:
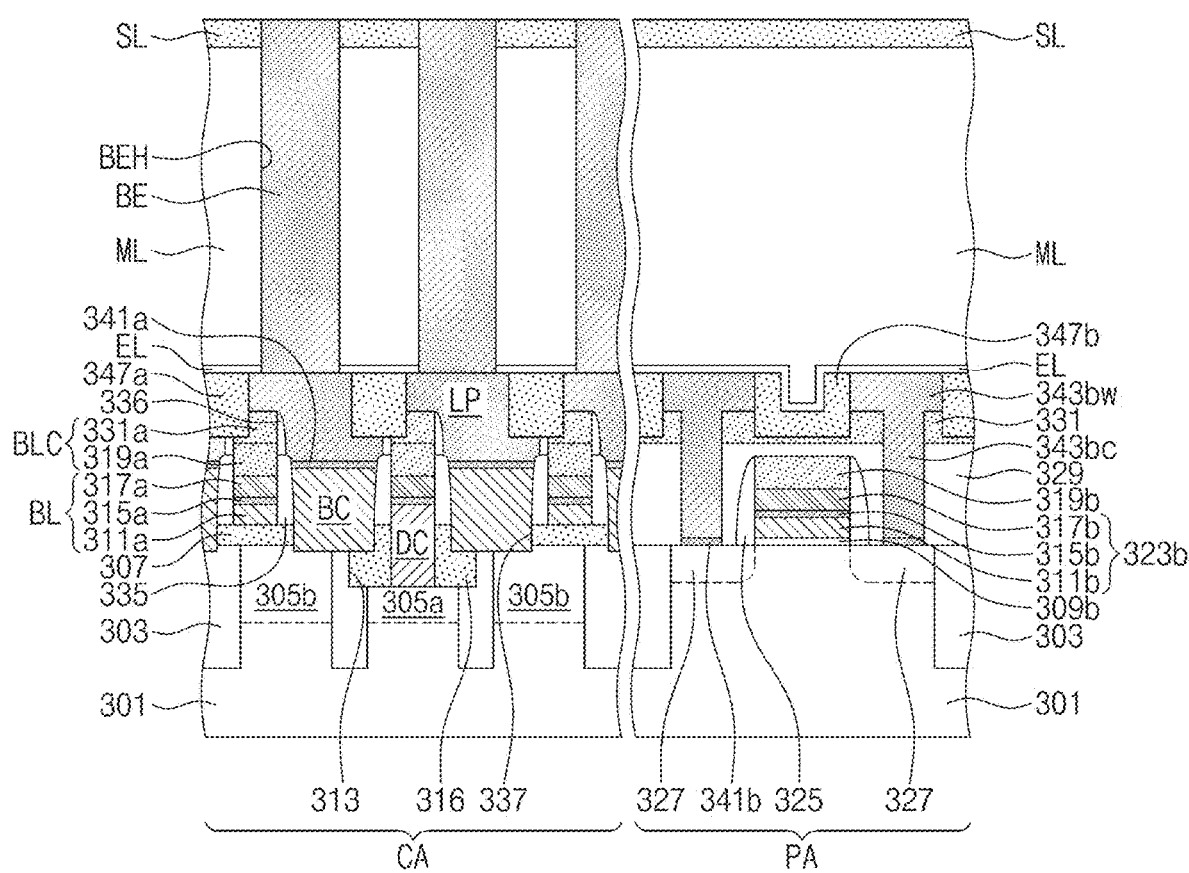
Figure 50:
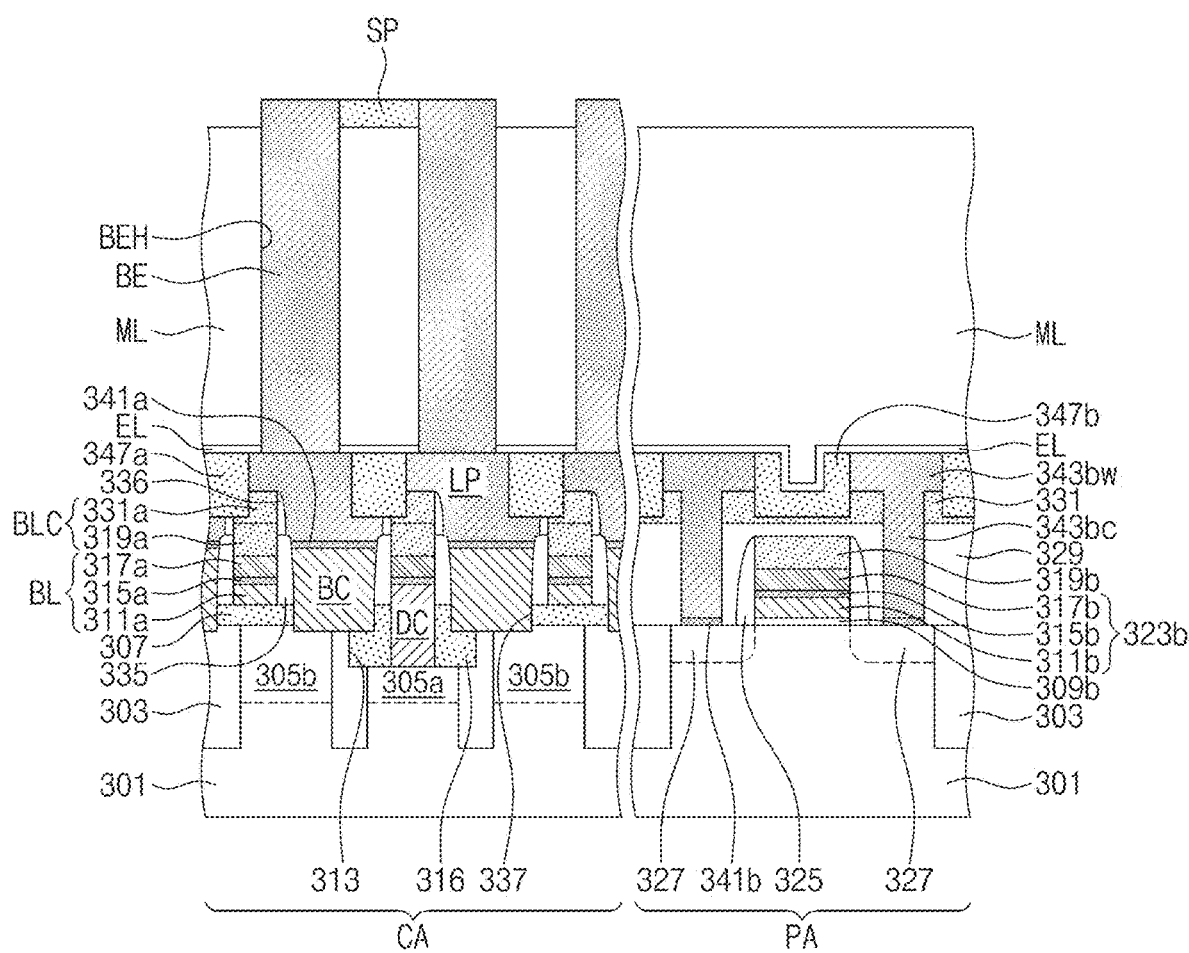
Figure 5P:
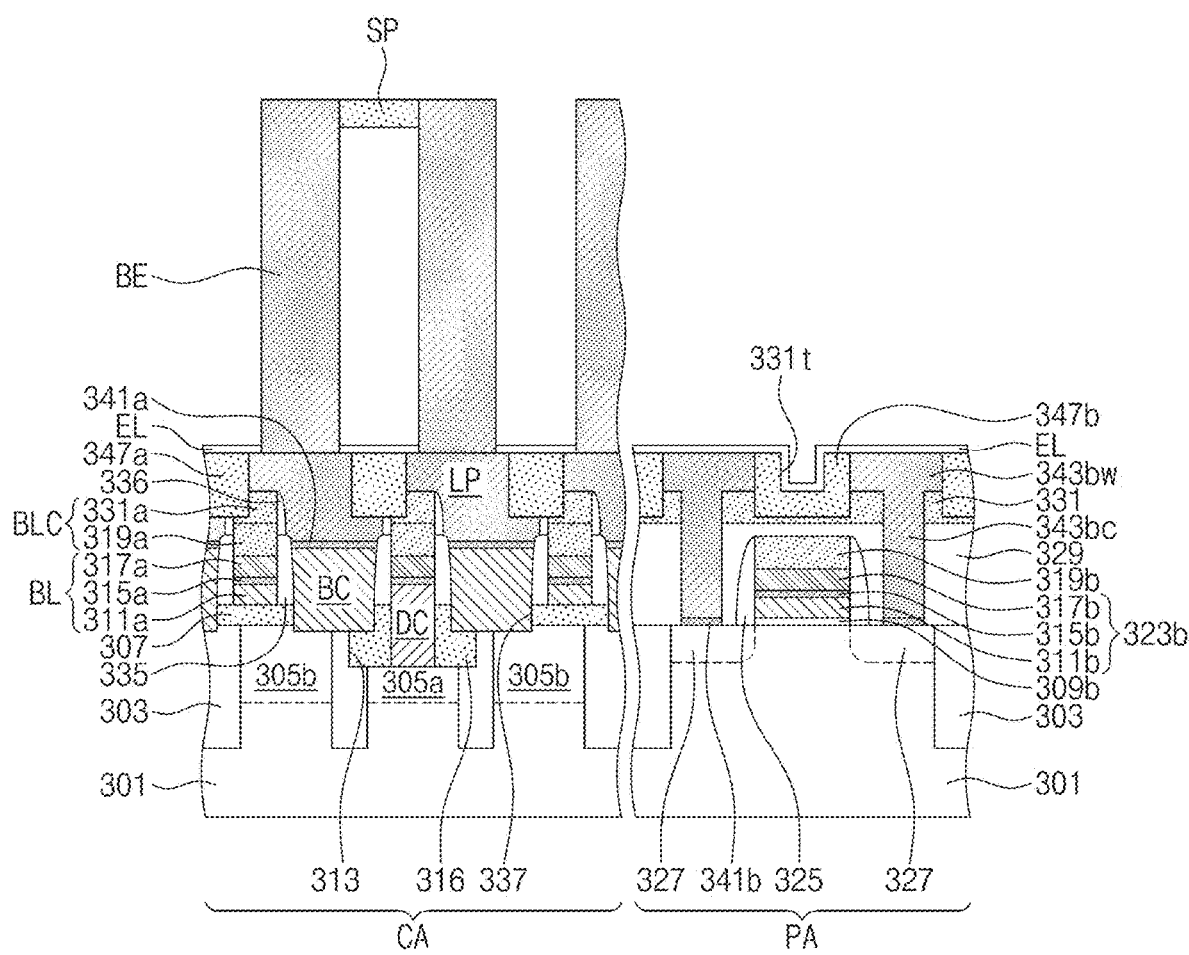
Figure 5Q:
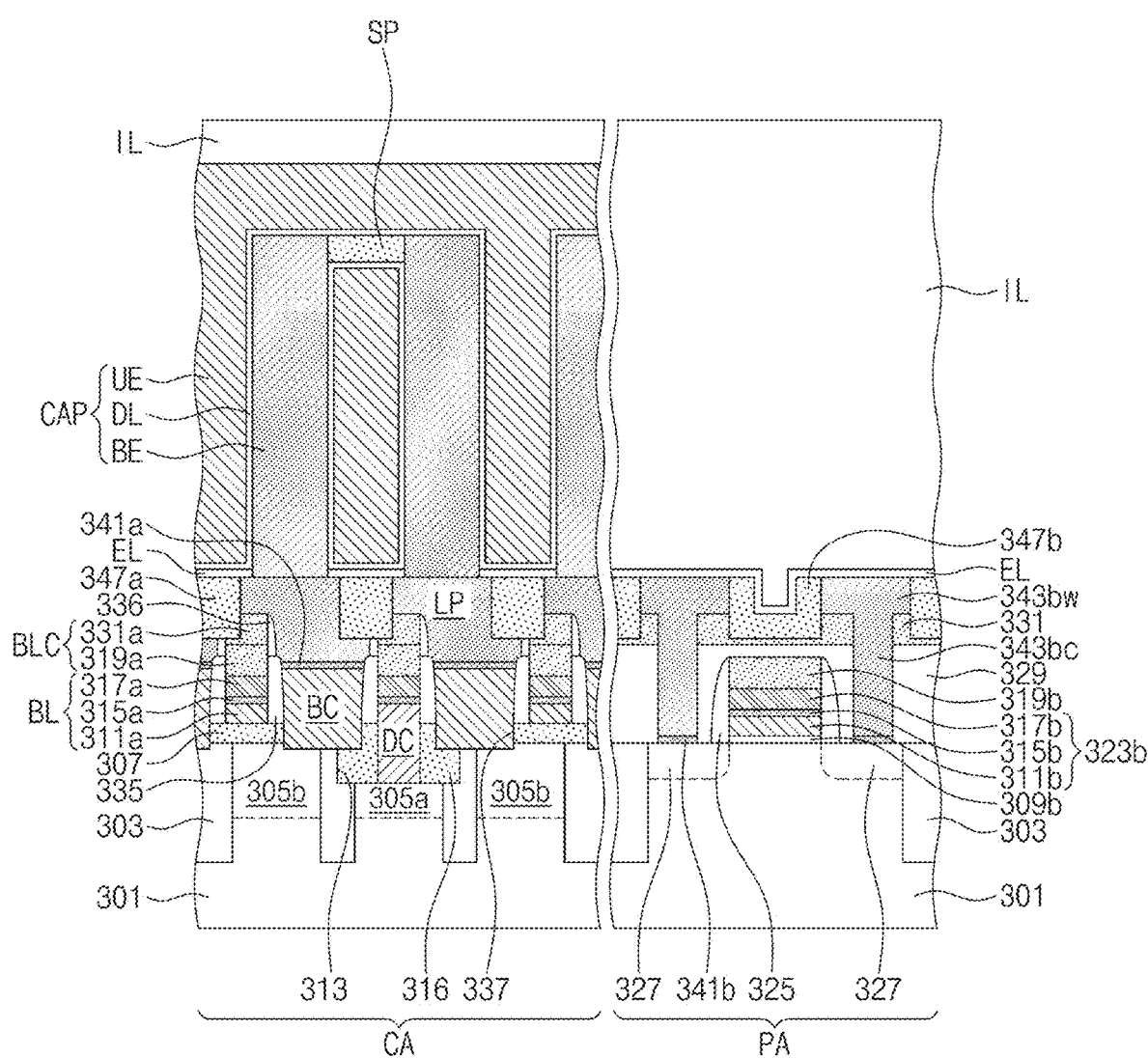

FIGS. 5A to 5Q are related cross-sectional views illustrating a method of fabricating a semiconductor device according to embodiments of the inventive concept.

Referring to FIGS. 1 and 5A, the semiconductor substrate 301 including the cell array region CA and the peripheral region PA may be prepared. The device isolation layer 303 may be formed in the semiconductor substrate 301 to define active portions ACTC and ACTP. Although not shown in FIG. 5A, word lines WL (e.g., of FIG. 1) may be formed on the cell array region CA to cross the active regions. In some embodiments, the word lines WL may be buried in the semiconductor substrate 301. A word line insulating layer may be interposed between the word lines WL and the semiconductor substrate 301. Word line capping patterns may be disposed on the word lines WL. The first impurity region 305a and the second impurity region 305b may be formed in the cell array region CA (e.g., in the semiconductor substrate 301 between the word lines).

The first interlayer insulating layer 307 may be formed on the cell array region CA of the semiconductor substrate 301. The first interlayer insulating layer 307 may include silicon nitride. Here, the first interlayer insulating layer 307 may be formed to expose an upper surface of the peripheral region PA of the semiconductor substrate 301. The peripheral gate insulating layer 309 may be formed on the upper surface of the peripheral region PA of the semiconductor substrate 301. The peripheral gate insulating layer 309 may include at least one of silicon nitride and metal oxide. When the peripheral gate insulating layer 309 is formed, the first interlayer insulating layer 307 may serve as a mask covering the cell array region CA.

Referring to FIG. 5B, a first poly-silicon layer may be deposited to cover the semiconductor substrate 301. The first poly-silicon layer may be doped with impurities. The first poly-silicon layer may be patterned to form a first polysilicon mask pattern 311, which has an opening that defines a position of the cell array region CA, on which a bit line contact DC will be formed. The first polysilicon mask pattern 311 may cover the peripheral region PA. A recess region 313 exposing the first impurity region 305a may be formed by patterning the first interlayer insulating layer 307 and the semiconductor substrate 301 using the first polysilicon mask pattern 311 as an etch mask. A portion of the device isolation layer 303 may also be etched during this process.

Referring to FIG. 5C, a second poly-silicon layer may be deposited on the semiconductor substrate 301 to fill the recess region 313. Then, a polishing process may be performed to expose the first polysilicon mask pattern 311 and to form a second polysilicon pattern 314 in the recess region 313. The second polysilicon pattern 314 may be formed to have an upper surface that is coplanar with an upper surface of the first polysilicon mask pattern 311. An ohmic layer 315, a metal-containing layer 317, and a first capping layer 319 may be sequentially stacked on the second polysilicon pattern 314 and the first polysilicon mask pattern 311. The ohmic layer 315 may include a metal silicide (e.g., cobalt silicide). The metal-containing layer 317 may include at least one titanium nitride and tungsten. The first capping layer 319 may include silicon nitride. A first mask pattern 321 may be formed on the first capping layer 319. The first mask pattern 321 may define a peripheral gate electrode on the peripheral region PA. The first mask pattern 321 may be formed to cover the entirety of the cell array region CA. The first mask pattern 321 may include at least one of a photoresist material and a carbon-containing material.

Referring to FIG. 5D, the first capping layer 319, the metal-containing layer 317, the ohmic layer 315, the first polysilicon mask pattern 311, and the peripheral gate insulating layer 309 on the peripheral region PA may be sequentially patterned using the first mask pattern 321 as an etch mask to expose the upper surface of the semiconductor substrate 301 and to form a peripheral gate insulating pattern 309b, a peripheral gate electrode 323b, and a peripheral gate capping pattern 319b. The peripheral gate electrode 323b may include a peripheral polysilicon pattern 311b, a peripheral ohmic pattern 315b, and a peripheral metal-containing pattern 317b, which are sequentially stacked.

After the etching process forming the peripheral gate electrode 323b, the first mask pattern 321 may be removed. Thereafter, a peripheral spacer 325 may be formed to cover side surfaces of the peripheral gate capping pattern 319b, the peripheral gate electrode 323b, and the peripheral gate insulating pattern 309b.

An ion implantation process may be performed to form peripheral source/drain regions 327 in portions of the semiconductor substrate 301 around the peripheral gate electrode 323b. After the formation of the peripheral source/drain regions 327, a second interlayer insulating layer 329 may be formed on the semiconductor substrate 301. The second interlayer insulating layer 329 may include at least one of silicon oxide, silicon oxynitride, silicon nitride, and porous oxide. Thereafter, a polishing process may be performed on the second interlayer insulating layer 329 to expose an upper surface of the first capping layer 319 on the cell array region CA.

Referring to FIGS. 5D and 5E, a second capping layer 331 may be formed to cover the entirety of the semiconductor substrate 301. The second capping layer 331 may include silicon nitride. A second mask pattern 333 may be formed on the second capping layer 331 to define a region, on which a bit line BL will be formed, on the cell array region CA. The second mask pattern 333 may include at least one of a photoresist material and a carbon-containing material. The second mask pattern 333 may be formed to cover the entirety of the peripheral region PA. The second capping layer 331, the first capping layer 319, the metal-containing layer 317, the ohmic layer 315, the first polysilicon mask pattern 311, and the second polysilicon pattern 314 on the cell array region CA may be patterned using the second mask pattern 333 as an etch mask to form the bit line contact DC and a bit line BL, a first bit line capping pattern 319a, and a second bit line capping pattern 331a, which are disposed on the bit line contact DC.

An inner side surface and a portion of a lower surface of the recess region 313 may be exposed by the etching process for forming the bit line BL. In addition, an upper surface of the first interlayer insulating layer 307 may be exposed. In the recess region 313, a side surface of the bit line contact DC may be exposed.

Referring to FIG. 5F, an insulating layer may be deposited and etched to form a gapfill insulating pattern 316 that substantially fills the recess region 313. Here, the gapfill insulating pattern 316 may include at least one of silicon nitride, silicon oxide, or silicon oxynitride, and may be a single layer structure or a multi-layered structure. The formation of the gapfill insulating pattern 316 may be performed to expose the upper surface of the first interlayer insulating layer 307. A spacer layer may be conformally formed on the semiconductor substrate 301. Then, an anisotropic etching process may be performed to form a first bit line spacer 335 covering side surfaces of the bit line BL, the first bit line capping pattern 319a, and the second bit line capping pattern 331a. The first bit line spacer 335 may include at least one of silicon nitride, silicon oxide, and silicon oxynitride, and may be a single layer structure or a multi-layered structure. The first bit line capping pattern 319a and the second bit line capping pattern 331a may constitute a bit line capping pattern BLC.

Referring to FIG. 5G, the first interlayer insulating layer 307 between the bit lines BL may be etched to form a storage node contact hole exposing the second impurity region 305b. During this process, the gapfill insulating pattern 316, the device isolation layer 303, and the semiconductor substrate 301 may be partially etched. A doped poly-silicon layer may be deposited to cover the entirety of the semiconductor substrate 301 and to fill the storage node contact hole. Then, an anisotropic etching process, in which a mask (e.g., a photoresist pattern) is not used, may be performed to form a storage node contact BC partially filling the storage node contact hole. The first bit line spacer 335 may be partially removed to expose an upper side surface of the bit line capping pattern BLC. An additional spacer layer may be conformally formed, and then, an etch-back process may be performed to form a second bit line spacer 336 on the first bit line spacer 335. Here, the second bit line spacer 336 may have a width less than a width of the first bit line spacer 335.

Referring to FIG. 5H, the second capping layer 331 and the second interlayer insulating layer 329 on the peripheral region PA may be sequentially patterned to form a peripheral contact hole 339 exposing the peripheral source/drain region 327. A silicidation process may be performed to form a storage node ohmic layer 341a on the storage node contact BC and to form a peripheral ohmic layer 341b on an upper surface of the semiconductor substrate 301 exposed by the peripheral contact hole 339.

Referring to FIG. 5I, a second metal-containing layer 343 may be formed to cover the semiconductor substrate 301 to fill the storage node contact hole and the peripheral contact hole 339. In some embodiments, the second metal-containing layer 343 may include titanium nitride and tungsten. A mask pattern MK may be formed on the second metal-containing layer 343. The mask pattern MK may define a shape of a landing pad LP and a shape of a peripheral conductive pattern 343bw. The mask pattern MK may include at least one of a photoresist, a silicon oxide, a polysilicon, a silicon nitride, a silicon oxynitride, SOH, and an amorphous carbon layer (ACL).

Referring to FIGS. 5I and 5J, the second metal-containing layer 343 may be etched using the mask pattern MK as an etch mask to form the landing pad LP. Here, the landing pad LP is electrically connected to the storage node contact BC in the cell array region CA. During this process, a peripheral conductive pattern 343bw and a first peripheral contact 343bc in the peripheral contact hole 339 may be formed on the peripheral region PA. The peripheral conductive pattern 343bw may be an interconnection line or a contact pad, which is provided in the peripheral circuit region. An upper portion of the second capping layer 331 may be partially removed by the etching process. In this case, a first trench 331t may be formed in the second capping layer 331. In addition, the second bit line capping pattern 331a and the second bit line spacer 336 may also be partially etched by the etching process. Thus, empty spaces GAP may be formed between the landing pads LP. The empty space GAP may have a first width W1, as illustrated in FIG. 3A. The first trench 331t may have a second width W2 greater than the first width W1, as illustrated in FIG. 3B.

Referring to FIGS. 5J and 5K, a separation insulating layer 347 may be conformally formed to cover the semiconductor substrate 301. The separation insulating layer 347 may be formed with a thickness large enough to fill the empty spaces GAP between the landing pads LP, yet thin enough to fill a space between the peripheral conductive patterns 343bw. The separation insulating layer 347 may be formed to have a constant thickness (e.g., the sixth thickness T6 of FIG. 3B). In some embodiments, like the one illustrated in FIG. 3C, the separation insulating layer 347 may be formed such that the thickness on the lower surface of the first trench 331t (e.g., the sixth bottom thickness T6b of FIG. 3C) is greater than the thickness on the side surface of the peripheral conductive patterns 343bw (e.g., the sixth side thickness T6s of FIG. 3C).

The separation insulating layer 347 may include at least one of silicon nitride and silicon carbon nitride, and may be a single layer structure or a multi-layered structure. A protection layer 349 may be formed on the separation insulating layer 347. The protection layer 349 may include a material having an etch selectivity with respect to the separation insulating layer 347. For example, the protection layer 349 may be formed of SOH materials having excellent gap-filling properties. Alternately, the protection layer 349 may include at least one of silicon oxide, silicon oxynitride, silicon germanium, polysilicon, and a metal-containing material. The protection layer 349 may be formed to include a portion penetrating into a region between the peripheral conductive patterns 343bw.

Referring to FIGS. 5K and 5L, an unmasked etch-back process or a chemical mechanical polishing (CMP) process may be performed on the protection layer 349 to remove the protection layer 349 on the separation insulating layer 347, to expose the upper surface of the separation insulating layer 347, and to form a protection pattern 349p between the peripheral conductive patterns 343bw. Thereafter, an etching process (e.g., an unmasked etch-back process) may be performed on the separation insulating layer 347 to remove a portion of the separation insulating layer 347, to expose the upper surfaces of the landing pads LP and the upper surfaces of the peripheral conductive patterns 343bw, to form a landing pad separation pattern 347a between the landing pads LP, and to form a peripheral separation pattern 347b between the peripheral conductive patterns 343bw. Here, the protection pattern 349p may prevent the peripheral separation pattern 347p under the protection pattern 349p from being partially etched during the etching process.

Referring to FIGS. 5L and 5M, the peripheral separation pattern 347b may be exposed by selectively removing only the protection pattern 349p. An etch stop layer EL, a mold layer ML, and a supporting layer SL may be sequentially stacked on the semiconductor substrate 301. The etch stop layer EL may include silicon nitride. The mold layer ML may include silicon oxide. The supporting layer SL may include silicon nitride.

Referring to FIG. 5N, the supporting layer SL, the mold layer ML, and the etch stop layer EL on the cell array region CA may be etched to form bottom electrode holes BEH exposing the landing pads LP. A conductive layer may be formed to cover the entirety of the semiconductor substrate 301. Then, a CMP process or an etch-back process may be performed to form bottom electrodes BE in the bottom electrode holes BEH. The bottom electrodes BE may be disposed to have island-shaped structures that are spaced apart from each other, when viewed in a plan view. Each of the bottom electrodes BE may be shaped like a pillar, a plug, or a hollow cylinder.

Referring to FIGS. 5N and 5O, the supporting layer SL may be etched to expose a portion of an upper surface of the mold layer ML and to form a supporting pattern SP. The supporting pattern SP may be in partial contact with upper side surfaces of the bottom electrodes BE. The supporting layer SL may be completely removed from the peripheral region PA.

Referring to FIGS. 3B, 5O, and 5P, an isotropic etching process may be performed to remove the mold layer ML and to expose upper and side surfaces of the bottom electrodes BE, upper and lower surfaces of the supporting pattern SP, and an upper surface of the etch stop layer EL. In some embodiments, the isotropic etching process may be performed in an over-etching manner to completely remove the mold layer ML. In some regions, not only a portion of the etch stop layer EL, but also a portion of the peripheral separation pattern 347b may be removed by an etchant used during the isotropic etching process.

If the anisotropic etching process is performed on the separation insulating layer 347 without forming the protection pattern 349p (e.g., the method step of FIG. 5L), a peripheral separation pattern 347b may be formed having a spacer shape covering the side surfaces of the peripheral conductive patterns 343bw, and the second capping layer 331 of a fourth remaining thickness T4r (e.g., see FIG. 3B) may be exposed through the first trench 331t. In this case, not only a portion of the etch stop layer EL, but also the exposed portion of the second capping layer 331 under the first trench 331t may be removed by an etchant used for over-etching of the mold layer ML. Furthermore, the second interlayer insulating layer 329 may be etched by the etchant, which is used to remove the mold layer ML. In this case, empty spaces may be formed in the second interlayer insulating layer 329. When a conductive layer is deposited in a subsequent step, the empty spaces may be filled with the conductive layer, thereby creating an unwanted conductive path, and causing a short circuit.

In great contrast, embodiments of the inventive concept include the formation of the protection pattern 349p, such that the peripheral separation pattern 347b may be formed with a position-independent, constant thickness T6 (or alternately an increasing vertical thickness T6b—e.g., see FIG. 3C). Thus, it may be possible to prevent the etchant used to remove the mold layer ML from coming into contact with the second interlayer insulating layer 329. Accordingly, it may be possible to reduce the possibility of creating a process failure, thereby increasing manufacturing yield.

Referring to FIG. 5Q, a dielectric layer DL may be formed on the cell array region CA to conformally cover the bottom electrodes BE and the supporting pattern SP. Then, an upper electrode UE may be formed on the dielectric layer DL. Next, a third interlayer insulating layer IL may be formed to cover the entirety of the semiconductor substrate 301. Thereafter, a cell contact CT1, a cell interconnection line UM1, a second peripheral contact MC, and a peripheral interconnection line UM2 may be formed, as shown in FIG. 2A.

The semiconductor device of FIG. 2B may be formed by performing a subsequent processes (e.g., of forming the etch stop layer EL) while the protection pattern 349p is not removed in the step of FIG. 5L.

In methods of fabricating embodiments of the inventive concept like the semiconductor devices of FIGS. 4A and 4B, the step of forming the separation insulating layer 347 (e.g., of FIG. 5K) may include conformally and sequentially stacking first to third sub-insulating layers. In the step of FIG. 5L, the etch-back process on the separation insulating layer 347 may include performing the etch-back process on the first to third sub-insulating layers to form the first to third cell sub-insulating patterns SBL1a to SBL3a and the first to third peripheral sub-insulating patterns SBL1b to SBL3b of FIGS. 4A and 4B. Except for these differences, other steps and features of the fabrication methods according to the embodiments of the inventive concept may be performed in substantially the same or similar manner(s).

The first cell and peripheral sub-insulating patterns SBL1a and SBL1b may be formed as a result of the etching of the first sub-insulating layer. The second cell and peripheral sub-insulating patterns SBL2a and SBL2b may be formed as a result of the etching of the second sub-insulating layer. The third cell and peripheral sub-insulating patterns SBL3a and SBL3b may be formed as a result of the etching of the third sub-insulating layer. The second sub-insulating layer may include a material having an etch selectivity with respect to the first and third sub-insulating layers. For example, the second sub-insulating layer may be formed of silicon carbon nitride (SiCN), and the first and third sub-insulating layers may be formed of silicon nitride. The second sub-insulating layer may serve as an etch stop layer in the etch-back process on the separation insulating layer 347.

According to embodiments of the inventive concept, a semiconductor device may include a peripheral separation pattern with a thickness that is constant regardless of position, therefore the reliability of the semiconductor devices is improved. In a method of fabricating semiconductor devices according to embodiments of the inventive concept, by forming a protection pattern, it is possible to form a peripheral separation pattern having a constant thickness regardless of position (or alternately an increasing vertical thickness). Accordingly, it is possible to prevent an etchant used during the removing of the mold layer from entering an underlying insulating layer, thereby reducing the possibility of creating a process failure. As a result, manufacturing yield improves.

In the foregoing written description, some material layers, elements and/or components have been described as "including" one or more of a variety of suggested material(s)—e.g., metal(s), metal silicide(s), polysilicon(s), oxide(s), nitride(s), doped-polysilicon(s), etc. Those skilled in the art will appreciate that these examples are merely illustrative in nature, and are intended to teach or suggest a variety of options that practitioners seeking to make embodiments of the inventive concept may use. In some instances, the term "include" (or "including") denotes a "forming from" one or more of the suggested materials(s).

In the foregoing written description, some material layers, elements and/or components may be described as being "equal" in some physical attribute or characteristic—e.g., height, level, width, length, thickness, size, etc. Those skilled in the art will recognize that the term "equal" in this regard means "substantially equal"—allowing for routine variations in the fabrication of material layers, elements and/or components. In like manner, certain material layers, elements and/or components may be described as including the "same material." Those skilled in the art will recognize that the term "same material" in this regard means "substantially the same material"—allowing for routine variations in the composition of material layers, elements and/or components.

While embodiments of the inventive concept have been particularly shown and described, it will be understood by one of ordinary skill in the art that variations in form and detail may be made therein without departing from the spirit and scope of the inventive concept as defined by the following claims.

What is claimed is:

1. A semiconductor device, comprising:
    a substrate including a cell region and a peripheral region around the cell region;
    a bit line structure on the cell region of the substrate, the bit line structure including a first side and a second side opposite the first side;
    a first cell contact adjacent to the first side of the bit line structure;
    a second cell contact adjacent to the second side of the bit line structure;
    a cell contact separation pattern between the first cell contact and the second cell contact;
    a peripheral gate structure on the peripheral region of the substrate, the peripheral gate structure including a first side and a second side opposite the first side;
    a first interlayer insulating layer covering the peripheral gate structure;

a second interlayer insulating layer on the first interlayer insulating layer;
a first peripheral contact arranged adjacent to the first side of the peripheral gate structure and penetrating the first and second interlayer insulating layers;
a second peripheral contact arranged adjacent to the second side of the peripheral gate structure and penetrating the first and second interlayer insulating layers; and
a peripheral contact separation pattern between the first peripheral contact and the second peripheral contact,
wherein the peripheral contact separation pattern includes:
a first peripheral contact separation pattern having a trench that is defined by a first side surface, a second side surface opposite the first side surface, and a bottom surface between the first side surface and the second side surface; and
a second peripheral contact separation pattern filling the trench of the first peripheral contact separation pattern,
wherein the second peripheral contact separation pattern includes a concave top surface that is higher than a top surface of the second interlayer insulating layer, and
wherein a bottom surface of the second peripheral contact separation pattern is lower than the top surface of the second interlayer insulating layer.

2. The semiconductor device of claim 1, wherein the concave top surface of the second peripheral contact separation pattern is lower than a top surface of each of the first peripheral contact and the second peripheral contact.

3. The semiconductor device of claim 1, wherein a portion of the peripheral contact separation pattern is arranged in the second interlayer insulating layer.

4. The semiconductor device of claim 1, further comprising a third interlayer insulating layer covering the peripheral contact separation pattern, the first peripheral contact and the second peripheral contact,
wherein the third interlayer insulating layer includes a concave top surface that is vertically overlapped with the concave top surface of the second peripheral contact separation pattern.

5. The semiconductor device of claim 4, further comprising a fourth interlayer insulating layer on the third interlayer insulating layer,
wherein the fourth interlayer insulating layer includes a convex bottom surface that is aligned with the concave top surface of the third interlayer insulating layer.

6. The semiconductor device of claim 4, wherein a bottom surface of the third interlayer insulating layer is aligned with the concave top surface of the second peripheral contact separation pattern.

7. The semiconductor device of claim 1, wherein the concave top surface of the second peripheral contact separation pattern is vertically overlapped with the peripheral gate structure.

8. The semiconductor device of claim 1, further comprising a third interlayer insulating layer, wherein the third interlayer insulating layer is in contact with a top surface of the first peripheral contact separation pattern and the concave top surface of the second peripheral contact separation pattern.

9. The semiconductor device of claim 1, wherein the peripheral contact separation pattern is spaced apart from the first interlayer insulating layer.

10. The semiconductor device of claim 1, wherein each of the first cell contact and the second cell contact includes a buried contact and a landing pad that is on the buried contact, and
wherein the buried contact and the landing pad of each of the first cell contact and the second cell contact are electrically connected with an active pattern of the cell region of the substrate.

11. The semiconductor device of claim 1, wherein the second peripheral contact separation pattern is in contact with the first side surface, the second side surface, and the bottom surface of the trench of the first peripheral contact separation pattern.

12. A semiconductor device, comprising:
a substrate including a cell region and a peripheral region around the cell region;
a gate structure on the peripheral region of the substrate, the gate structure including a first side and a second side opposite the first side;
a first interlayer insulating layer covering the gate structure;
a first contact adjacent to the first side of the gate structure and in the first interlayer insulating layer;
a second contact adjacent to the second side of the gate structure and in the first interlayer insulating layer; and
a first contact separation pattern between the first contact and the second contact, the first contact separation pattern having a trench including a bottom surface;
a second contact separation pattern filling the trench of the first contact separation pattern, the second contact separation pattern including a concave top surface; and
a second interlayer insulating layer covering the first and second contact separation patterns and including a concave top surface,
wherein the second interlayer insulating layer is in contact with a top surface of the first contact separation pattern and the concave top surface of the second contact separation pattern.

13. The semiconductor device of claim 12, wherein the bottom surface of the trench of the first contact separation pattern is lower than a top surface of the first interlayer insulating layer.

14. The semiconductor device of claim 12, wherein the concave top surface of the second interlayer insulating layer is vertically overlapped with the concave top surface of the second contact separation pattern.

15. The semiconductor device of claim 12, wherein the concave top surface of the second contact separation pattern is higher than a top surface of the first interlayer insulating layer, and is lower than a top surface of each of the first contact and the second contact.

16. The semiconductor device of claim 12, wherein:
the first contact separation pattern includes silicon carbonitride (SiCN),
the second contact separation pattern includes silicon nitride (SiN), and
the second interlayer insulating layer includes silicon nitride (SiN).

17. A semiconductor device, comprising:
a substrate including a cell region and a peripheral region around the cell region, the cell region including a cell active pattern and the peripheral region including a peripheral active pattern;
a bit line structure on the cell region of the substrate, the bit line structure including a first side and a second side opposite the first side;

a first cell contact plug arranged adjacent to the first side of the bit line structure and electrically connected to the cell active pattern of the cell region of the substrate;

a second cell contact plug arranged adjacent to the second side of the bit line structure and electrically connected to the cell active pattern of the cell region of the substrate;

a first landing pad on the first cell contact plug;

a second landing pad on the second cell contact plug;

a cell separation pattern between the first landing pad and the second landing pad;

an etch stop layer on the cell separation pattern;

a lower electrode penetrating the etch stop layer and arranged on one of the first landing pad and the second landing pad;

a peripheral gate structure on the peripheral region of the substrate, the peripheral gate structure including a first side and a second side opposite the first side;

a first interlayer insulating layer covering the peripheral gate structure;

a second interlayer insulating layer on the first interlayer insulating layer;

a first peripheral contact plug adjacent to the first side of the peripheral gate structure, the first peripheral contact plug penetrating the first and second interlayer insulating layers and electrically connected to the peripheral active pattern of the peripheral region of the substrate;

a second peripheral contact plug adjacent to the second side of the peripheral gate structure, the second peripheral contact plug penetrating the first and second interlayer insulating layers and electrically connected to the peripheral active pattern of the peripheral region of the substrate;

a first conductive pattern on the first peripheral contact plug;

a second conductive pattern on the second peripheral contact plug;

a peripheral separation pattern between the first conductive pattern and the second conductive pattern, and in the second interlayer insulating layer;

a third interlayer insulating layer on the peripheral separation pattern, a fourth interlayer insulating layer on the third interlayer insulating layer; and a peripheral contact penetrating the third and fourth interlayer insulating layers and arranged on one of the first and second conductive patterns, wherein the peripheral separation pattern includes:
  a first peripheral separation pattern having a recess; and
  a second peripheral separation pattern in the recess of the first peripheral separation pattern, wherein the second peripheral separation pattern includes a concave top surface that is higher than a top surface of the second interlayer insulating layer, wherein a bottom surface of the second peripheral separation pattern is lower than the top surface of the second interlayer insulating layer, and wherein the third interlayer insulating layer includes a concave top surface that is vertically overlapped with the concave top surface of the second peripheral separation pattern.

18. The semiconductor device of claim 17, wherein:
the first peripheral separation pattern includes silicon carbonitride (SiCN),
the second peripheral separation pattern includes silicon nitride (SiN), and
the third interlayer insulating layer includes silicon nitride (SiN).

19. The semiconductor device of claim 17, wherein the concave top surface of the second peripheral separation pattern is lower than a top surface of each of the first conductive pattern and the second conductive pattern.

20. The semiconductor device of claim 17, wherein the third interlayer insulating layer is in contact with a top surface of the first peripheral separation pattern and the concave top surface of the second peripheral separation pattern.

* * * * *